(12) United States Patent
Zhang

(10) Patent No.: US 8,216,931 B2
(45) Date of Patent: *Jul. 10, 2012

(54) METHODS FOR FORMING MULTI-LAYER THREE-DIMENSIONAL STRUCTURES

(76) Inventor: Gang Zhang, Monterey Park, CA (US)

( * ) Notice: Subject to any disclaimer, the term of this patent is extended or adjusted under 35 U.S.C. 154(b) by 1159 days.

This patent is subject to a terminal disclaimer.

(21) Appl. No.: 11/548,207

(22) Filed: Oct. 10, 2006

(65) Prior Publication Data

US 2009/0239353 A1  Sep. 24, 2009

Related U.S. Application Data

(63) Continuation-in-part of application No. 11/278,137, filed on Mar. 30, 2006, now Pat. No. 7,696,102.

(60) Provisional application No. 60/725,421, filed on Oct. 11, 2005, provisional application No. 60/666,990, filed on Mar. 31, 2005.

(51) Int. Cl.
*H01L 21/4763* (2006.01)

(52) U.S. Cl. ............. 438/619; 438/49; 438/50; 438/51; 438/52; 438/53; 438/54; 438/55; 438/56; 438/57; 438/618; 438/622

(58) Field of Classification Search .............. 438/49–57, 438/618, 619, 622
See application file for complete search history.

(56) References Cited

U.S. PATENT DOCUMENTS

| | | | | |
|---|---|---|---|---|
| 4,920,639 A * | 5/1990 | Yee | ................................. | 29/846 |
| 5,011,580 A * | 4/1991 | Pan et al. | ...................... | 205/118 |
| 5,190,637 A | 3/1993 | Guckel | | |
| 5,576,147 A * | 11/1996 | Guckel et al. | .................. | 430/313 |
| 5,738,799 A * | 4/1998 | Hawkins et al. | ................ | 216/27 |
| 5,820,771 A * | 10/1998 | Burke et al. | ..................... | 216/27 |
| 5,955,818 A * | 9/1999 | Bertin et al. | .................... | 310/309 |
| 6,027,630 A | 2/2000 | Cohen | | |
| 6,332,568 B1 | 12/2001 | Christenson | | |
| 6,475,369 B1 | 11/2002 | Cohen | | |
| 6,572,742 B1 | 6/2003 | Cohen | | |
| 6,607,934 B2 * | 8/2003 | Chang et al. | .................... | 438/50 |
| 6,790,377 B1 | 9/2004 | Cohen | | |
| 7,091,604 B2 * | 8/2006 | Wylie et al. | .................... | 257/713 |
| 7,323,143 B2 * | 1/2008 | Anderson et al. | ............. | 422/100 |
| 7,332,410 B2 * | 2/2008 | Tong | ............................ | 438/455 |

(Continued)

OTHER PUBLICATIONS

Cohen, et al., "EFAB: Rapid, Low-Cost Desktop Micromachining of High Aspect Ratio True 3-D MEMS," Proceedings of 12th IEEE Micro Electro Mechanical Systems Workshop 1999, Orlando, Florida, pp. 244-251 (1999).

(Continued)

*Primary Examiner* — Bac Au

(57) ABSTRACT

Embodiments are directed to the formation of multi-layer three-dimensional structures by forming and attaching a plurality of layers where each of the plurality of layers comprises at least one structural material forming a pattern and where at least one of the plurality of layers comprises at least one sacrificial material. In one embodiment, the formation of a multi-layer three-dimensional structure comprises (1) forming a plurality of individual layers and (2) attaching at least the formed plurality of individual layers together. In another embodiment, the formation of a multi-layer three-dimensional structure comprises (1) attaching an individual layer onto a substrate or onto a previously formed layer; (2) processing the attached individual layer to form a new layer comprising at least one material forming a pattern; and (3) repeating the steps of (1) and (2) one or more times.

29 Claims, 25 Drawing Sheets

U.S. PATENT DOCUMENTS

| | | | |
|---|---|---|---|
| 7,494,557 B1* | 2/2009 | Peterson | 156/89.11 |
| 2002/0164111 A1* | 11/2002 | Mirza | 385/18 |
| 2004/0000489 A1* | 1/2004 | Zhang et al. | 205/118 |
| 2004/0007470 A1 | 1/2004 | Smalley | |
| 2005/0023145 A1 | 2/2005 | Cohen | |
| 2005/0202667 A1* | 9/2005 | Cohen et al. | 438/622 |
| 2007/0089993 A1* | 4/2007 | Schwartz et al. | 205/133 |

OTHER PUBLICATIONS

Christenson, et al., "A Batch Wafer Scale LIGA Assembly and Packaging Technique via Diffusion Bonding," Proceedings of 12th IEEE Micro Electro Mechanical Systems Workshop 1999, Orlando, Florida, pp. 476-481 (1999).

Zhang, "Electrochemical microfabrication for high-aspect ratio 3-D microstructures," Proceedings of SUR/FIN 2005, St. Louis, Missouri, pp. 412-431 (2005).

Fréchette, "High-Speed Microfabricated Silicon Turbomachinery and Fluid Film Bearings", Journal of Microelectromechanical Systems, vol. 14, No. 1, pp. 141-152 (2005).

* cited by examiner

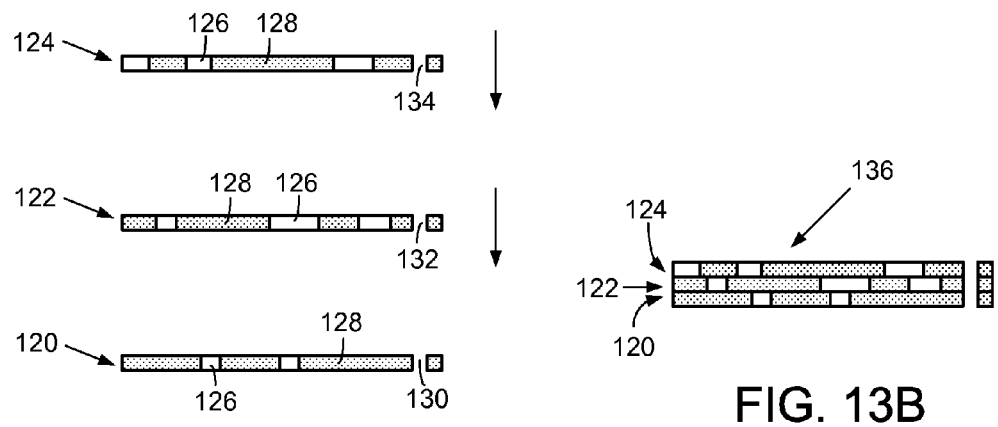
FIG. 13A
FIG. 13B
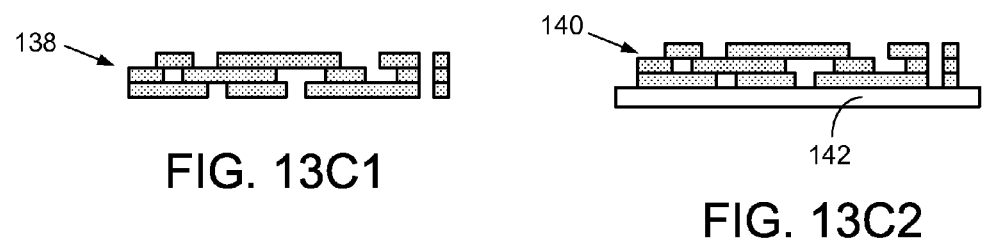
FIG. 13C1
FIG. 13C2
FIG. 13C3

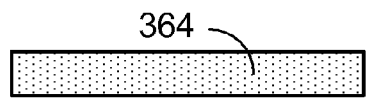
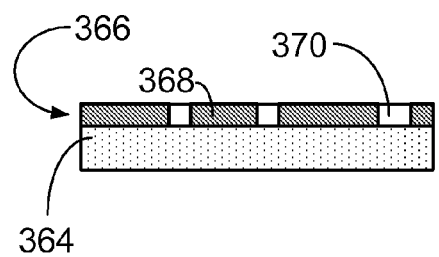
FIG. 26A    FIG. 26B
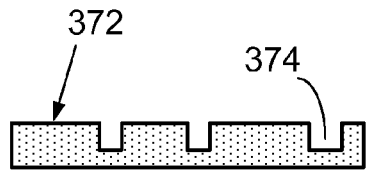
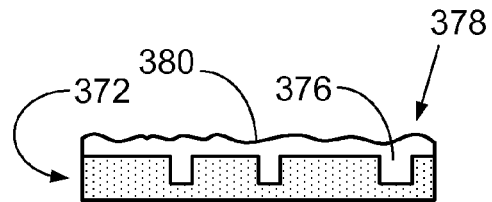
FIG. 26C    FIG. 26D
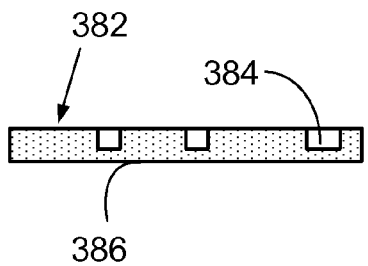
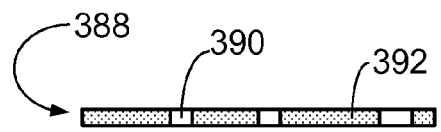
FIG. 26E    FIG. 26F

METHODS FOR FORMING MULTI-LAYER THREE-DIMENSIONAL STRUCTURES

CROSS-REFERENCE TO RELATED APPLICATIONS

This application claims the benefit of provisional patent application Ser. No. 60/725,421, filed Oct. 11, 2005 by the present inventor. This application is also a continuation-in-part of U.S. Non-Provisional patent application Ser. No. 11/278,137, filed Mar. 30, 2006 now U.S. Pat. No. 7,696,102, which claims the benefit of provisional patent application Ser. No. 60/666,990, filed Mar. 31, 2005 by the present inventor.

FIELD OF THE INVENTION

This invention generally relates to forming multi-layer structures. More particularly, it relates to fabrication processes for fabricating multi-layer three-dimensional (3-D) meso- and micro-structures by forming and attaching a plurality of layers where each of the layers comprises one or more materials forming a desired pattern.

BACKGROUND OF THE INVENTION

MEMS (Microelectromechanical Systems) technology enables to fabricate microdevices with reduced size, weight, cost and power demanding, and yet with improved performance, functionality and reliability. The conventional or silicon-based MEMS fabrication techniques, which are derived directly from microelectronics or IC technologies, are not only planar (2-D) processes with low-aspect-ratios, but also material-limited. Rapid growth of MEMS calls for new fabrication techniques for manufacturing high-aspect-ratio complex three-dimensional (3-D) microdevices.

Multi-layer fabrication techniques are so far the most promising and versatile methods for fabricating complex three-dimensional microstructures with high-aspect-ratios for MEMS. U.S. Pat. No. 5,190,637, issued on Mar. 2, 1993 to Henry Guckel, and U.S. Pat. No. 6,027,630, issued on Feb. 22, 2000 to Adam L. Cohen, teach two fabrication methods for forming three-dimensional metal microstructures by using multi-layer electrochemical deposition. The only difference between the two methods is the way to perform the selective electrochemical deposition of metals. The essential elements of these two methods are described as follows.

(1) Three-dimensional microstructures are fabricated by using a successive layer-by-layer approach, meaning that a given layer can only be built after the pervious layer is completed.

(2) Each layer contains at least two different materials. In the case of a two-material system, one is a sacrificial material and the other is a structural material.

(3) Both structural material and sacrificial material are fabricated by using electrochemical deposition methods such as electrodeposition.

(4) After the deposition of both materials for building a given layer, a planarization process is used to machine the deposited materials to a predetermined thickness and to a flat and smooth surface as a base for building a next layer on it.

(5) After all layers have been built, the sacrificial material is etched to release the three-dimensional microstructures.

Although the above two multilayer electrochemical fabrication methods are practical for building complex three-dimensional microstructures, there are at least five(5) major drawbacks inherently associated with them, which are:

(1) Low throughput. Production throughput becomes an issue as the number of layers in the microdevices increases. This is because the above two multilayer fabrication methods are a successive layer-by-layer process. A given layer can only be built after the pervious layer is completed. The two main risks associated with a successive layer-by-layer process are: 1) When one layer meets fabrication problems, the fabrication process flow for this build has to be suspended until the problems are solved; and 2) If a build has to be discarded due to various reasons during fabrication, all previously fabricated layers have to be wasted.

(2) Low yield. In reality, each layer inevitably contains some defects. These defects may distribute at different locations on each layer. Therefore, the final yield of acceptable structures is an issue.

(3) Limited material selection. Electrochemical deposition can only be used to fabricate metals and alloys. It cannot or cannot easily make many important engineering and semiconductor materials such as stainless steel, aluminum and its alloys, titanium and its alloys, silicon, and non-metal materials. Further, although electrodeposition can be used to make many metals and alloys, only a small portion of them can be made practically and economically for mass production. Even among the metals and alloys that can be readily electrodeposited, there are those whose material properties are not as desired as those of the corresponding bulk materials. Therefore the multi-layer electrochemical fabrication methods taught in the two patents have limited applications.

(4) Layer thickness limitation. The maximum metal layer thickness is restricted by the mask thickness (e.g., photoresist). The ability to select the layer thickness freely is crucial to the multilayer approach. For example, in some cases, several successive thin layers may have to be deposited to reach a required thickness if a single thick layer cannot be formed. Obviously, this would increase production time, decrease production throughput and lower product yield.

(5) Structure geometry limitation. The multi-layer electrochemical fabrication methods can manufacture complex three-dimensional metal microstructures. However, there exist some types of shapes which cannot be fabricated. This structure geometry limitation is related to the etching of sacrificial material. If sacrificial material cannot be removed (e.g., in a sealed cavity with no etching access paths) or cannot be removed easily (e.g., in a long, narrow channel), microstructures with these shapes cannot be made with the two multi-layer methods.

U.S. Pat. No. 6,332,568 to Todd R. Christenson issued on Dec. 25, 2001 teaches a method to make multi-layer microstructures via diffusion bonding of subassemblies to form a united structure. This method allows the parallel manufacture of a series of subassemblies which compose a microstructure or micromachine. Each subassembly is built on a separate substrate. Then according to a predetermined configuration of the microstructure, the second subassembly is diffusion bonded onto the first subassembly. The substrate of the second subassembly is separated from the bonded two subassemblies after diffusion bonding. Therefore the substrate of a subassembly can be viewed as a sacrificial material as the substrate needs to be removed after one bonding operation is done. The above two steps (diffusion bonding and separation) are repeated until all the subassemblies are bonded to form a united structure. Compared with the multi-layer electrochemical fabrication approaches, the advantage of Christenson's approach is that all the required subassemblies for a microstructure can be built separately. However, the bonding of the subassemblies is still a successive process, meaning that the previous subassembly must be bonded before a given subassembly can be bonded. Diffusion bonding involves heat and pressure. Assume that a microstructure comprises ten subassemblies. Only the last ($10^{th}$) subassembly undergoes heat and pressure treatment one time. All other nine subassemblies undergo heat and pressure treatment at least two times. The first two ($1^{st}$ and $2^{nd}$) subassemblies even undergo heat and pressure treatment nine times. The heat and pressure treatment may change the material properties of a microstructure or may distort the components of a microstructure. Therefore, practically this bonding method can only work for the very limited number of subassemblies although in theory there is no limit on the number of subassemblies that can be joined.

In addition, as each of two subassemblies to be bonded contains a substrate which increases the difficulty for the alignment of micro-components on the two substrates before bonding. The reason that Christenson's approach has to use a substrate as part of a subassembly is that the substrate works as a mechanical support for micro-components on it. Without this substrate, all components on the substrate will fall apart. It is very difficult to align two subassembly with their substrates as micro-components are located between two substrates during alignment. The micro-components on the two substrates could be damaged due to this difficult alignment as the components are not protected and cannot be protected. After two subassemblies are bonded together, an extra process step has to be operated to separate one of the substrates, which not only increases process time and cost, but also may damage the bonded micro-components.

Direct bonding of pre-micromachined partial microstructures such as silicon structures to form relatively complex three-dimensional microstructures is a common method in MEMS manufacturing. For examples, Luc G. Fréchette et al. reported a method for building a silicon micromachined air turbine by direct bonding of five bulk micromachined silicon wafers in their paper "High-Speed Microfabricated Silicon Turbomachinery and Fluid Film Bearings" published in Journal of Microelectromechanical Systems (Vol. 14, No. 1, pp. 141-152, 2005). However, this approach (bulk micromachining plus silicon bonding) has its intrinsic drawbacks that only makes it suitable for building devices with limited 3-D geometries. The drawbacks are summarized as follows.

When we fabricate a microdevice, we actually fabricate multiple same microdevices (i.e., dies) on a substrate, so-called batch manufacturing. If we divide a complex three-dimensional device or a group of three-dimensional devices into multiple layers, we will find that at least some of the layers comprise isolated or discrete features at die level, at wafer level (no mechanical connection between devices), or at both die level and wafer level. Note that a discrete feature means that it does not mechanically connect with other features on the same layer. Obviously this kind of layer cannot be made separately as discrete features will fall down. This is a fundamental drawback in bulk micromachining plus silicon bonding. To overcome this technical barrier, special fabrication approaches have to be implemented. For example, for making the layers containing discrete features, one solution is to use temporary silicon connections which support discrete silicon features. After all layers are bonded together, the temporary silicon connections are then cut to release the discrete features. However, this post-treatment only works for special designs. In addition, it is not a reliable and desirable approach as the removal of the mechanical connections is the last step of the process. If it fails, all previous work will be wasted. To avoid making the layers containing discrete features, one solution is to do multiple etching on both sides of silicon layers. However, deep etching can be performed only once on each side of a layer, which restricts to form more complex structures. Besides, this solution involves many process steps and faces difficult operations, low throughput and low yield.

Another intrinsic drawback of this technology (bulk micromachining plus silicon bonding) is related to deep etching processes such as DRIE (Deep Reactive Ion Etching). The DRIE etch rate distributes non-uniformly both locally and globally over a silicon wafer depending on feature geometry and feature distribution. Although the etch parameters of DRIE can be adjusted to an extent to lessen this effect, non-uniformity cannot be avoided. In addition, after DRIE, one has to accept as-is for both etched depth non-uniformity and etched surface smoothness since there does not exist a post-treatment process for improving non-uniformity and smoothness.

Summarily, although bulk micromachining plus silicon bonding is an approach to form relatively complex silicon microstructures, the intrinsic drawbacks of this approach restrict it to build limited 3-D microstructures and make it a quite complicated and low yield process as well. Microdevices have to be designed to fit into the capabilities of this approach so that desired geometries or structures have to be compromised or even sacrificed, and optimal performance usually cannot be achieved.

SUMMARY OF THE INVENTION

A first aspect of the present invention provides a method for fabricating a multi-layer three-dimensional structure, comprising: (a) forming a material layer on a temporary substrate wherein the material layer comprises at least one material wherein the at least one material comprises at least one structural material forming a pattern comprising at least one structural feature; (b) removing the temporary substrate to free the material layer; (c) repeating the steps of (a) and (b) one or more times to form a plurality of material layers wherein at least one of the plurality of material layers comprises a plurality of discrete structural features wherein the plurality of discrete features are held together with at least one sacrificial material; and (d) attaching at least the plurality of material layers together in a predetermined arrangement.

A second aspect of the present invention provides a method for fabricating a multi-layer three-dimensional structure, comprising: (a) forming a material layer on a temporary substrate wherein the material layer comprises at least one material wherein the at least one material comprises at least one structural material forming a pattern comprising at least one structural feature; (b) removing the temporary substrate to free the material layer; (c) repeating the steps of (a) and (b) one or more times to form a plurality of material layers wherein at least one of the plurality of material layers comprises a plurality of discrete structural features wherein the plurality of discrete features are held together with at least one sacrificial material; (d) attaching at least the plurality of material layers together in a predetermined arrangement; and (e) removing at least a portion of the at least one sacrificial material.

A third aspect of the present invention provides a method for fabricating a multi-layer three-dimensional structure, comprising: (a) providing a substrate; (b) attaching a layer of a material onto the substrate or onto a previously formed layer; (c) processing the layer of the material to form a new layer comprising at least one material forming a pattern, wherein one of the at least one material is the material of the layer of the material, wherein the at least one material comprises at least one structural material, and wherein the processing operation comprises at least forming at least one opening in the layer of the material; and (d) repeating the steps of (b) and (c) one or more times to form the multi-layer three-dimensional structure, wherein at least one layer of the multi-layer three-dimensional structure comprises at least one sacrificial material.

A fourth aspect of the present invention provides a method for fabricating a multi-layer three-dimensional structure, comprising: (a) providing a substrate; (b) attaching a layer of a material onto the substrate or onto a previously formed layer; (c) processing the layer of the material to form a new layer comprising at least one material forming a pattern, wherein one of the at least one material is the material of the layer of the material, wherein the at least one material comprises at least one structural material, and wherein the processing operation comprises at least forming at least one opening in the layer of the material; (d) repeating the above steps of (b) and (c) one or more times to form the multi-layer three-dimensional structure, wherein at least one layer of the multi-layer three-dimensional structure comprises at least one sacrificial material; and (e) removing at least a portion of the at least one sacrificial material.

A fifth aspect of the present invention provides a method for fabricating a multi-layer three-dimensional structure, comprising: (a) forming a plurality of individual layers, wherein each of the plurality of individual layers comprises at least a structural material forming a pattern comprising at least one structural feature, and wherein at least one of the plurality of individual layers comprises a plurality of discrete structural features wherein the plurality of discrete structural features are held together with at least one sacrificial material; (b) attaching at least the plurality of individual layers together in a predetermined arrangement; (c) removing at least a portion of the at least one sacrificial material, thereby forming the multi-layer three-dimensional structure; and (d) surface-treating the multi-layer three-dimensional structure by removing a portion of a surface of the multi-layer three-dimensional structure and/or by forming at least one layer over at least a portion of a surface of the multi-layer three-dimensional structure.

A sixth aspect of the present invention provides a method for fabricating a multi-layer three-dimensional structure, comprising: (a) forming a plurality of individual layers, wherein each of the plurality of individual layers comprises at least a structural material forming a pattern comprising at least one structural feature, and wherein at least one of the plurality of individual layers comprises a plurality of discrete structural features wherein the plurality of discrete structural features are held together with at least one sacrificial material; (b) attaching at least the plurality of individual layers together in a predetermined arrangement; (c) removing at least a portion of the at least one sacrificial material, thereby forming the multi-layer three-dimensional structure wherein the multi-layer three-dimensional structure comprises a structural material of nickel-titanium (NiTi) alloy; and (d) selectively removing nickel from at least a portion of a surface of the NiTi alloy with chemical etching or electrochemical etching to reduce the amount of nickel on the at least a portion of the surface of the NiTi alloy.

A seventh aspect of the present invention provides a method for fabricating a multi-layer three-dimensional structure, comprising: (a) forming a plurality of individual layers, wherein each of the plurality of individual layers comprises at least a silicon material forming a pattern comprising at least one silicon feature, and wherein at least one of the plurality of individual layers comprises a plurality of discrete silicon features wherein the plurality of discrete silicon features are held together with at least one sacrificial material; (b) attaching at least the plurality of individual layers together in a predetermined arrangement with silicon direct bonding at a first bonding temperature to reach a first bonding strength such that the first bonding temperature prevents bonding failure caused by thermal stress due to the mismatch in coefficient of thermal expansion between the silicon material and the at least one sacrificial material, and the first bonding strength prevents delamination of the bonded at least the plurality of individual layers throughout the below removing step (c); (c) removing the at least one sacrificial material from the bonded at least the plurality of individual layers; and (d) annealing the bonded at least the plurality of individual layers at a second bonding temperature to reach a second bonding strength wherein the second bonding temperature is greater than the first bonding temperature and wherein the second bonding strength is greater than the first bonding strength.

An eighth aspect of the present invention provides a method for fabricating a multi-layer three-dimensional structure, comprising: (a) providing a layer of a sacrificial material; (b) forming at least one opening in the layer of the sacrificial material to form a pattern; (c) filling at least one structural material into at least one of the at least one opening to form a multi-material layer comprising at least two materials, wherein the at least one structural material forms a structural pattern comprising at least one structural feature wherein the at least one structural feature is a portion of the multi-layer three-dimensional structure; (d) repeating the steps of (a), (b), and (c) one or more times to form a plurality of multi-material layers, wherein at least one of the plurality of multi-material layers comprises a plurality of discrete structural features wherein the plurality of discrete structural features are held together with the sacrificial material; and (e) attaching at least the plurality of multi-material layers together in a predetermined arrangement.

A ninth aspect of the present invention provides a method for fabricating a multi-layer three-dimensional structure, comprising: (a) providing a layer of a sacrificial material; (b) forming at least one opening in the layer of the sacrificial material to form a pattern; (c) filling at least one structural material into at least one of the at least one opening to form a multi-material layer comprising at least two materials, wherein the at least one structural material forms a structural pattern comprising at least one structural feature wherein the at least one structural feature is a portion of the multi-layer three-dimensional structure; (d) repeating the steps of (a), (b), and (c) one or more times to form a plurality of multi-material layers, wherein at least one of the plurality of multi-material layers comprises a plurality of discrete structural features wherein the plurality of discrete structural features are held together with the sacrificial material; (e) attaching at least the plurality of multi-material layers together in a predetermined arrangement; and (f) removing at least a portion of the sacrificial material.

A tenth aspect of the present invention provides a method for fabricating a multi-layer three-dimensional structure, comprising: (a) forming a plurality of individual layers, wherein each of the plurality of individual layers comprises at least a structural material forming a pattern comprising at least one structural feature, and wherein at least one of the plurality of individual layers comprises a plurality of discrete structural features wherein the plurality of discrete structural features are held together with at least one sacrificial material; (b) attaching at least the plurality of individual layers together in a predetermined arrangement, wherein all structural features of the plurality of individual layers form one or more structural components wherein the one or more structural components form the multi-layer three-dimensional structure; and (c) removing at least a portion of the at least one sacrificial material from the attached at least the plurality of individual layers to release the multi-layer three-dimensional structure, wherein all of the one or more structural components of the multi-layer three-dimensional structure are immovable.

An eleventh aspect of the present invention provides a method for fabricating an individual layer comprising at least two materials forming a pattern, comprising: (a) attaching or depositing a layer of a first material onto a temporary substrate; (b) forming at least one opening in the layer of the first material to form a pattern; (c) filling at least a second material into at least one of the at least one opening, and (d) removing the temporary substrate to free the formed layer.

A twelfth aspect of the present invention provides a method for fabricating an individual layer comprising at least two materials forming a pattern, comprising: (a) forming at least a first material over at least one selected region of a temporary substrate to form a pattern; (b) forming at least a second material over at least a portion of the at least first material and at least one selected exposed region of the temporary substrate to form a multi-material structure; (c) planarizing the multi-material structure to at least reach a predetermined thickness such that at least a portion of the at least a portion of the at least first material covered by the at least a second material is exposed, thereby forming the material layer, and (d) removing the temporary substrate to free the formed layer.

A thirteenth aspect of the present invention provides a method for fabricating an individual layer comprising at least two materials forming a pattern, comprising: (a) providing a layer of a first material comprising a top surface and a bottom surface opposite to the top surface; (b) forming at least one blind opening from the top surface to form a pattern; (c) filling at least a second material into at least one of the at least one blind opening, and (d) planarizing at least the bottom surface at least to form a new bottom surface wherein at least the second material in at least one filled blind opening is exposed in the new bottom surface.

A fourteenth aspect of the present invention provides a method for fabricating a multi-layer three-dimensional structure, comprising: (a) forming a plurality of individual layers, wherein each of the plurality of individual layers comprises at least a structural material forming a pattern comprising at least one structural feature, wherein at least one of the plurality of individual layers comprises a plurality of discrete structural features wherein the plurality of discrete structural features are held together with at least one sacrificial material, and wherein the formation of at least one of the plurality of individual layers, the at least one layer comprising at least two materials forming a pattern, comprises (i) providing a layer of a first material comprising a top surface and a bottom surface opposite to the top surface; (ii) forming at least one blind opening from the top surface; (iii) filling at least a second material into at least one of the at least one blind opening; and (iv) planarizing at least the bottom surface at least to form a new bottom surface wherein at least the second material in at least one filled blind opening is exposed in the new bottom surface; and (b) attaching at least the plurality of individual layers together in a predetermined arrangement.

A fifteenth aspect of the present invention provides a method for fabricating a multi-layer three-dimensional structure, comprising: (a) forming a plurality of individual layers, wherein each of the plurality of individual layers comprises at least a structural material forming a pattern comprising at least one structural feature, wherein at least one of the plurality of individual layers comprises a plurality of discrete structural features wherein the plurality of discrete structural features are held together with at least one sacrificial material, and wherein the formation of at least one of the plurality of individual layers, the at least one layer comprising at least two materials forming a pattern, comprises (i) providing a layer of a first material comprising a top surface and a bottom surface opposite to the top surface; (ii) forming at least one blind opening from the top surface; (iii) filling at least a second material into at least one of the at least one blind opening; and (iv) planarizing at least the bottom surface at least to form a new bottom surface wherein at least the second material in at least one filled blind opening is exposed in the new bottom surface; (b) attaching at least the plurality of individual layers together in a predetermined arrangement; and (c) removing at least a portion of the at least one sacrificial material.

Other aspects of the invention may involve combinations of the above aspects of the invention, repetition of all steps or some of the steps in some of the above aspects of the invention (e.g., to form multi-material individual single layers), post-treatment of formed multi-layer three-dimensional structures, and other configurations, structures and processes which have not been specifically set forth above. Further aspects of the invention will become apparent from a consideration of the ensuring description and drawings.

It is an advantage of some aspects of the invention to provide a method for forming complex multi-layer three-dimensional structures comprising micro-scale or meso-scale features.

It is an advantage of some aspects of the invention to provide a method for forming multi-layer three-dimensional structures by using a parallel fabrication approach so that it can produce a high production throughput.

It is an advantage of some aspects of the invention to provide a method for forming multi-layer three-dimensional structures, which can produce a high yield of multi-layer three-dimensional structures.

It is an advantage of some aspects of the invention to provide a method for forming multi-layer three-dimensional structures where a broad range of materials can be used as structural materials of multi-layer three-dimensional structures.

It is an advantage of some aspects of the invention to provide a method for forming multi-layer three-dimensional structures where a broad range of thicknesses of single layers can be formed.

It is an advantage of some aspects of the invention to provide a method for forming multi-layer three-dimensional structures that may comprise sealed cavities and long narrow channels.

It is an advantage of some aspects of the invention to provide a method for forming multi-layer three-dimensional structures by attaching a plurality of individual single layers and/or a plurality of individual groups of layers together where at least one of the layers comprises at least one sacrificial material that combines discrete structural features on the same layer together.

It is an advantage of some aspects of the invention to provide a method for forming multi-layer three-dimensional structures by attaching a plurality of individual single layers and/or a plurality of individual groups of layers together where the layers may not have a continuous flat surface.

It is an advantage of some aspects of the invention to provide a method for forming multi-layer three-dimensional structures by attaching a plurality of individual single layers and/or a plurality of individual groups of layers together where the layers may comprise one or more openings.

Further advantages of various aspects and embodiments of the invention will be apparent to those of skill in the art upon review of the teachings herein. The various aspects of the invention, set forth explicitly herein or otherwise ascertained from the teachings herein, may address one or more of the above advantages alone or in combination, or alternatively may address some other advantages ascertained from the teachings herein. It is not necessarily intended that all advantages be addressed by any single aspect of the invention event though that may be the case with regard to some aspects.

BRIEF DESCRIPTION OF THE DRAWINGS

FIGS. 13A-13C3 schematically depict side views at various stages of a first example of a process for forming a multi-layer three-dimensional structure by attaching individual single layers according to the first embodiment where the process includes elements exemplified in the block diagrams of FIGS. 2, 3, 4, 7, 9, 11.

FIGS. 26A-26F provide schematic illustrations of side views at various stages of an example of the process of FIG. 21 for building a single layer comprising two materials, stainless steel and nickel.

DETAILED DESCRIPTION OF PREFERRED EMBODIMENTS OF THE INVENTION

Figure 1:
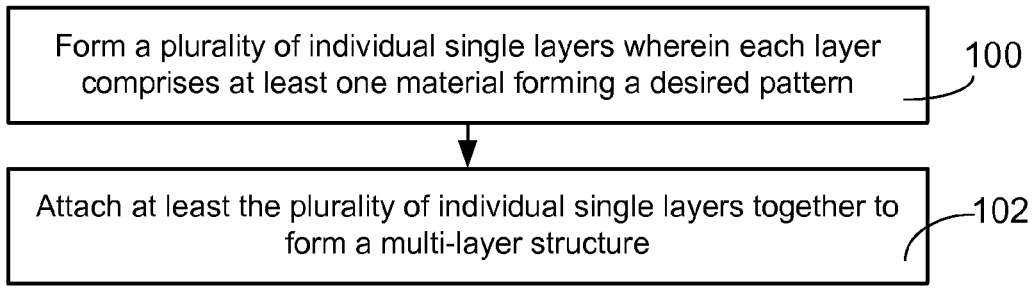
FIG. 1 provides a block diagram of a process of a first generalized embodiment of the present invention where a multi-layer structure is formed via forming and attaching at least the plurality of individual single layers together.

FIG. 1 provides a block diagram of a process of a first generalized embodiment of the present invention where a multi-layer structure is formed via forming and attaching at least a plurality of individual single layers together.

Block 100 calls for forming a plurality of individual single layers. At least one portion of each of the plurality of individual single layers is a portion of a multi-layer three-dimensional structure to be formed. Each layer comprises at least one material which forms a desired pattern where at least one of the at least one material is a structural material of the multi-layer structure. In addition, at least one of the plurality of individual single layers comprises at least one sacrificial material. Material or materials on the different layers may be the same, some same and some different, or totally different. Various processes for forming individual single layers will be described in detail hereinafter in the third embodiment of the invention.

The functions of sacrificial material are described as follows. In the present invention, to form a complex three-dimensional structure, it is first divided into a plurality of layers in the design stage. These layers are then fabricated and attached to form the structure. With this method, we can find that one or more of the layers usually contain isolated or discrete structural features. Note that a discrete feature means that it does not mechanically connect with other features on the same layer. This is specially true in microfabrication as people want to fabricate multiple same or different structures or devices on a same substrate simultaneously, each of which is an independent unit that is not connected with other units on the substrate. If we divide these structures or devices into multiple layers, each layer contains multiple partial structures of the independent units. As these partial structures are not connected together, they become the isolated structures on the layers. A layer containing isolated features or structures cannot be made without a means to support them as they will fall down. For example, U.S. Pat. No. 6,332,568 to Todd R. Christenson issued on Dec. 25, 2001 teaches a method to make multi-layer microstructures via diffusion bonding of subassemblies to form a united structure. In his invention, isolated features of each subassembly are formed on a substrate. In other words, the substrate supports the isolated features. Unlike Christenson's method, in the present invention at least one sacrificial material is used to hold isolated structural features together on the same layer where the sacrificial material functions like an adhesive and the sacrificial material is a portion of the layer.

If one or more of the plurality of layers does not contain isolated features, sacrificial material may not be used. However, as a micromachined layer is usually quite fragile, it is therefore still desired to use sacrificial material to be a portion of the layer as it can protect structures such as microstructures of the layer and enhance the strength and robustness of the layer.

As the sacrificial material is not an integral material of the three-dimensional structure, it is usually removed after the plurality of layers are attached together. However, if the existence of the sacrificial material will not influence what the structure is designed to do, part or even all of it may be left in the structure.

Block 102 calls for attaching at least the plurality of individual single layers together to form a desired multi-layer structure. Attaching techniques for block 102 may include the use of bonding (e.g., diffusion bonding, fusing bonding, anodic bonding, and the like), adhering (e.g., via using an adhesion material), laminating, pressing, heating, rolling, mechanical means, and the like. Attaching operations may be implemented in a variety of different ways. In some cases only one attaching technique may be used. In some cases a combination of different attaching techniques may be used together. Still in some cases one attaching technique or a combination of attaching techniques may be used for some layers and another attaching technique or another combination of attaching techniques may be used for other layers. Those skilled in the art will understand that there are many other different ways to use attaching techniques.

Figure 2:
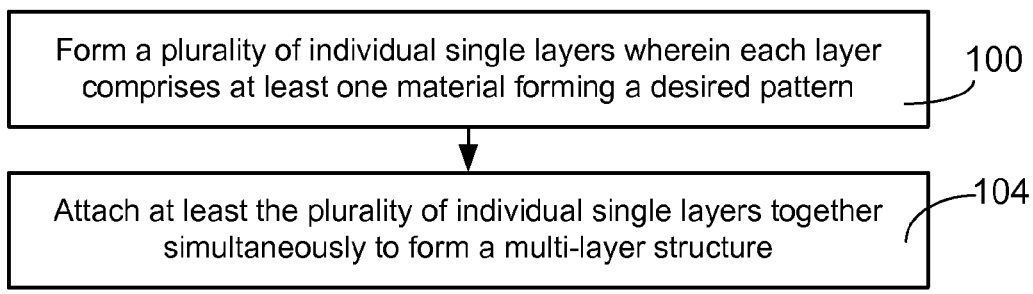
FIG. 2 provides a block diagram of a process of a first variation of the first generalized embodiment of FIG. 1 where at least a plurality of individual single layers are attached together simultaneously.

FIG. 2 provides a block diagram of a process of a first variation of the first generalized embodiment of FIG. 1 where at least a plurality of individual single layers are attached together simultaneously.

The process of FIG. 2 begins with the operation of block 100 as discussed above and thereafter proceeds to block 104.

Block 104 of FIG. 2 calls for attaching at least the plurality of individual single layers together simultaneously to form a desired multi-layer structure. In other words, all of the layers are attached together at one time.

Figure 3:
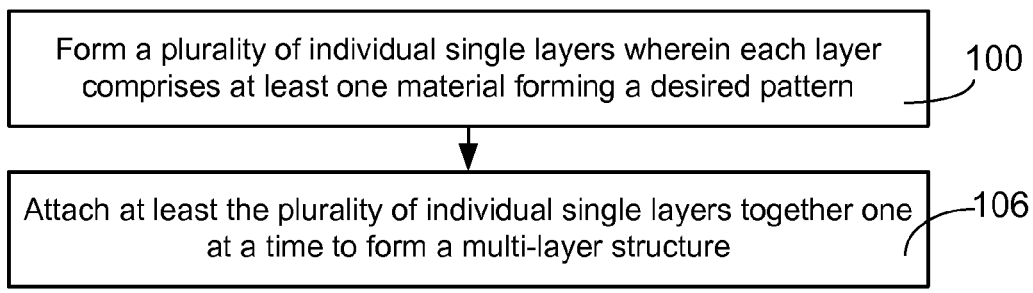
FIG. 3 provides a block diagram of a process of a second variation of the first generalized embodiment of FIG. 1 where at least a plurality of individual single layers are attached together one at a time.

FIG. 3 provides a block diagram of a process of a second variation of the first generalized embodiment of FIG. 1 where at least a plurality of individual single layers are attached together one at a time.

The process of FIG. 3 begins with the operation of block 100 as discussed above and thereafter proceeds to block 106.

Block 106 of FIG. 3 calls for attaching at least the plurality of individual single layers together one at a time to form a desired multi-layer structure. In other words, a desired layer is first attached to an another desired layer. This operation is repeated a plurality of times until at least all of the layers are attached together.

Figure 4:
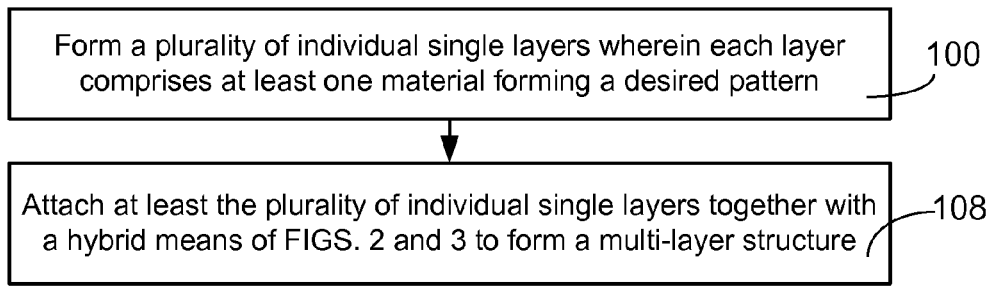
FIG. 4 provides a block diagram of a process of a third variation of the first generalized embodiment of FIG. 1 where at least a plurality of individual single layers are attached together with a hybrid process of FIGS. 2 and 3.

FIG. 4 provides a block diagram of a process of a third variation of the first generalized embodiment of FIG. 1 where at least a plurality of individual single layers are attached together with a hybrid process of FIGS. 2 and 3.

The process of FIG. 4 begins with the operation of block 100 as discussed above and thereafter proceeds to block 108.

Block 108 of FIG. 4 calls for attaching at least the plurality of individual single layers together with a hybrid process of FIGS. 2 and 3 to form a desired multi-layer structure. For example, in one case for forming a multi-layer structure, some layers are first attached together one by one to form an individual group of layers. Then this group of layers and at least the rest of the plurality of individual single layers are attached together simultaneously. Those skilled in the art will understand that there are many different ways to use this hybrid attaching process.

Figure 5:
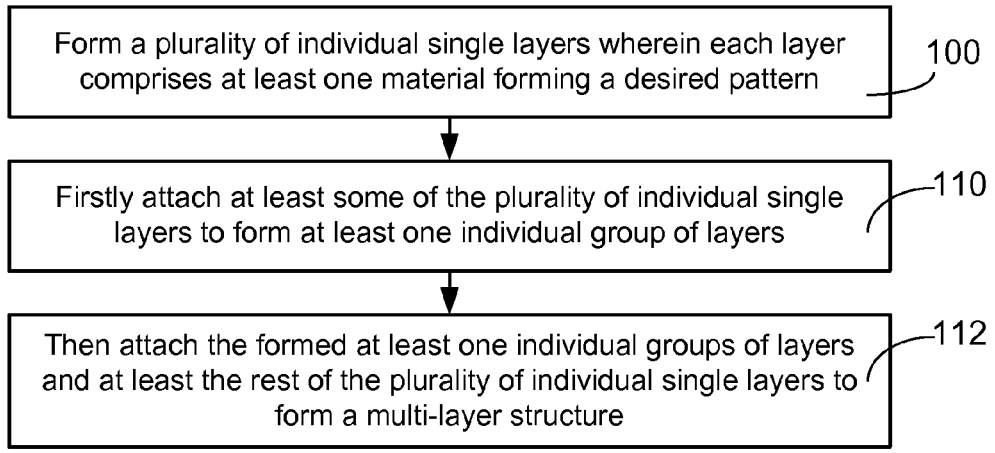
FIG. 5 provides a block diagram of a process of a fourth variation of the first generalized embodiment of FIG. 1 where first at least some of a plurality of individual single layers are attached to form at least one individual group of layers and then the formed at least one individual group of layers and at least the rest of the plurality of individual single layers are attached to form a multi-layer structure.

FIG. 5 provides a block diagram of a process of a fourth variation of the first generalized embodiment of FIG. 1 where firstly at least some of a plurality of individual single layers are attached to form at least one individual group of layers and then the formed at least one individual group of layers and at least the rest of the plurality of individual single layers are attached to form a multi-layer structure.

The process of FIG. 5 begins with the operation of block 100 as discussed above and thereafter proceeds to block 110.

Block 110 of FIG. 5 calls for attaching at least some of the plurality of individual single layers to form at least one individual group of layers. The attaching operation may use the process of FIG. 2, the process of FIG. 3, or the process of FIG. 4.

Block 112 of FIG. 5 calls for attaching at least the formed at least one individual group of layers and at least the rest of the plurality of individual single layers (if there are still individual single layers left after the process of block 110) to form a desired multi-layer structure. Again the attaching operation may use the process of FIG. 2, the process of FIG. 3, or the process of FIG. 4.

The process of FIG. 5 is useful in some cases as some of the layers need to be handled separately before a final attaching is operated.

Figure 6:
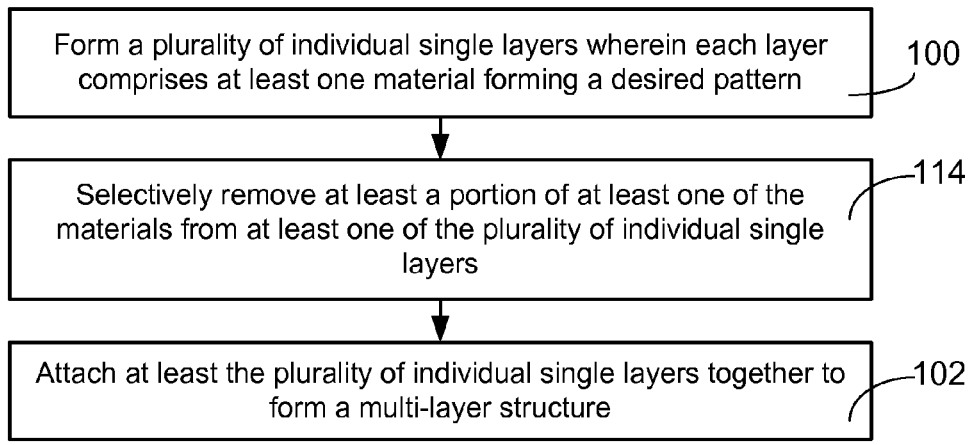
FIG. 6 provides a block diagram of a process of a fifth variation of the first generalized embodiment of FIG. 1 where after forming a plurality of individual single layers at least a portion of at least one of the materials is selectively removed from at least one of the plurality of individual layers prior to attaching at least them together to form a multi-layer structure.

FIG. 6 provides a block diagram of a process of a fifth variation of the first generalized embodiment of FIG. 1 where after forming a plurality of individual single layers at least a portion of at least one of the materials (e.g., sacrificial material) is selectively removed from at least one of the plurality of individual layers prior to attaching at least them together to form a multi-layer structure.

The process of FIG. 6 begins with the operation of block 100 as discussed above and thereafter proceeds to block 114.

Block 114 of FIG. 6 calls for selectively removing at least a portion of at least one of the materials from at least one of the plurality of individual layers. Removing techniques for block 114 may include chemical dissolution, electrochemical dissolution, dry etching (e.g., plasma etching), vaporization, mechanical means, and the like. Removing operations may be implemented in a variety of different ways. In some cases only one removing technique may be used. In some cases a combination of different removing techniques may be used together. Still in some cases one removing technique or a combination of removing techniques may be used for some layers and another removing technique or another combination of removing techniques may be used for other layers. Those skilled in the art will understand that there are many other different ways to use removing techniques.

Block 102 of FIG. 6 calls for attaching at least the plurality of individual single layers together to form a desired multi-layer structure as discussed above.

Figure 7:
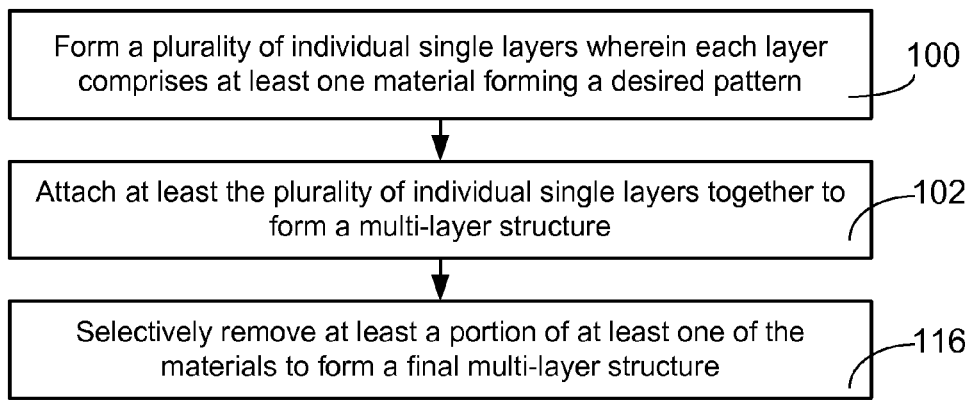
FIG. 7 provides a block diagram of a process of a sixth variation of the first generalized embodiment of FIG. 1 where after forming a plurality of individual single layers and attaching at least the plurality of individual single layers together at least a portion of at least one of the materials is removed to form a final multi-layer structure.

FIG. 7 provides a block diagram of a process of a sixth variation of the first generalized embodiment of FIG. 1 where after forming a plurality of individual single layers and attaching at least the plurality of individual single layers together at least a portion of at least one of the materials is removed to form a final multi-layer structure.

The process of FIG. 7 begins with the operations of block 100 and 102 as discussed above and thereafter proceeds to block 116.

Block 116 calls for selectively removing at least a portion of at least one of the materials (e.g., sacrificial material) from the formed multi-layer structure to form a desired final multi-layer structure. Similar to the operation of block 114, removing techniques for block 116 may include chemical dissolution, electrochemical dissolution, dry etching (e.g., plasma etching), vaporization, mechanical means, and the like. Removing operations may be implemented in a variety of different ways. In some cases only one removing technique may be used. In some cases a combination of different removing techniques may be used together. Still in some cases one removing technique or a combination of removing techniques may be used for one material or a portion of one material and another removing technique or another combination of removing techniques may be used for another material or a portion of another material. Those skilled in the art will understand that there are many other different ways to use removing techniques.

Figure 8:
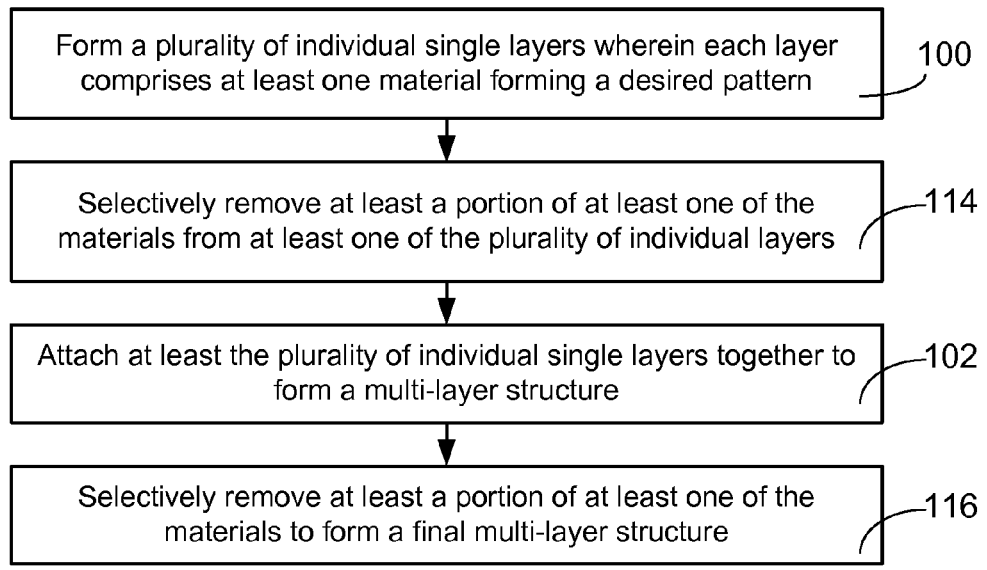
FIG. 8 provides a block diagram of a process of a seventh variation of the first generalized embodiment of FIG. 1 where a combination process of FIGS. 6 and 7 is used to form a desired multi-layer structure.

FIG. 8 provides a block diagram of a process of a seventh variation of the first generalized embodiment of FIG. 1 where a combination process of FIGS. 6 and 7 is used to form a desired multi-layer structure.

The process of FIG. 8 calls for the operations of blocks 100, 114, 102 and 116, respectively, which have been discussed above.

Figure 9:
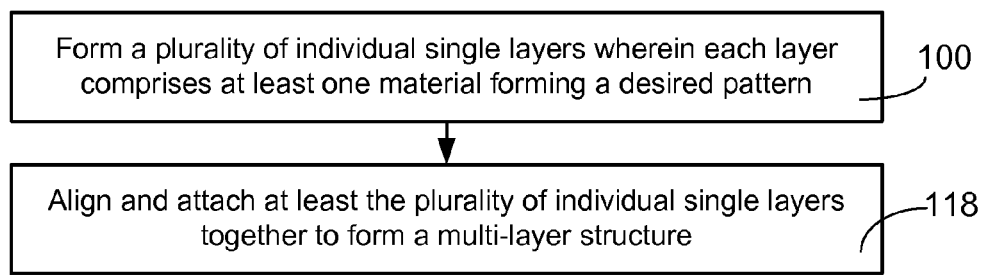
FIG. 9 provides a block diagram of a process of an eighth variation of the first generalized embodiment of FIG. 1 where an alignment operation is performed before attaching at least a plurality of individual single layers together to form a multi-layer structure.

FIG. 9 provides a block diagram of a process of an eighth variation of the first generalized embodiment of FIG. 1 where an alignment operation is performed before attaching at least a plurality of individual single layers together to form a multi-layer structure.

The process of FIG. 9 begins with the operations of block 100 as discussed above and thereafter proceeds to block 118.

Block 118 of FIG. 9 calls for first aligning and then attaching at least the plurality of individual single layers together to form a multi-layer structure. The function of the alignment operation is to establish a spatial relationship between at least the plurality of layers, which is required to form a desired multi-layer structure in some cases. Alignment between the layers may be realized via aligning alignment marks specially formed on each layer. Alignment may also be realized via aligning alignment marks formed outside of the layers where the outside alignment marks have a spatial relationship with each layer or one or more feature on each layer. Still alignment may be realized via using alignment marks both on the layers and outside the layers. Those skilled in the art will understand there are other alignment means that may be incorporated with the present invention. The alignment operation may be preformed by using alignment equipment.

Attaching techniques and operations for block 118 have been discussed above in FIG. 1.

Figure 10:
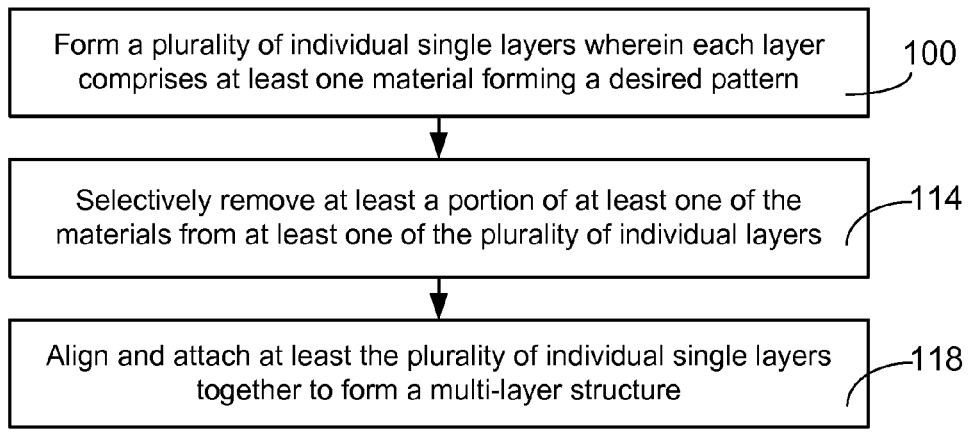
FIG. 10 provides a block diagram of a process of a ninth variation of the first generalized embodiment of FIG. 1 where after forming a plurality of individual single layers at least a portion of at least one of the materials is selectively removed from at least one of the plurality of individual layers prior to aligning and attaching at least them together to form a multi-layer structure.

FIG. 10 provides a block diagram of a process of a ninth variation of the first generalized embodiment of FIG. 1 where after forming a plurality of individual single layers at least a portion of at least one of the materials (e.g., sacrificial material) is selectively removed from at least one of the plurality of individual layers prior to aligning and attaching at least them together to form a multi-layer structure.

The process of FIG. 10 is similar to that of FIG. 6 with the exception that an alignment operation is performed before attaching at least the plurality of individual single layers together.

Figure 11:
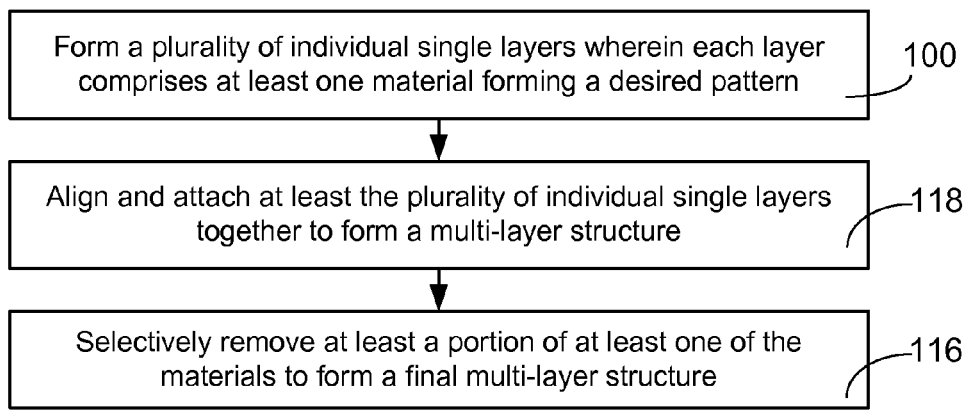
FIG. 11 provides a block diagram of a process of a tenth variation of the first generalized embodiment of FIG. 1 where after forming a plurality of individual single layers and aligning and attaching at least the plurality of individual single layers together at least a portion of at least one of the materials is removed to form a final multi-layer structure.

FIG. 11 provides a block diagram of a process of a tenth variation of the first generalized embodiment of FIG. 1 where after forming a plurality of individual single layers and aligning and attaching at least the plurality of individual single layers together at least a portion of at least one of the materials (e.g., sacrificial material) is removed to form a final multi-layer structure.

The process of FIG. 11 is similar to that of FIG. 7 with the exception that an alignment operation is performed before attaching at least the plurality of individual single layers together.

Figure 12:
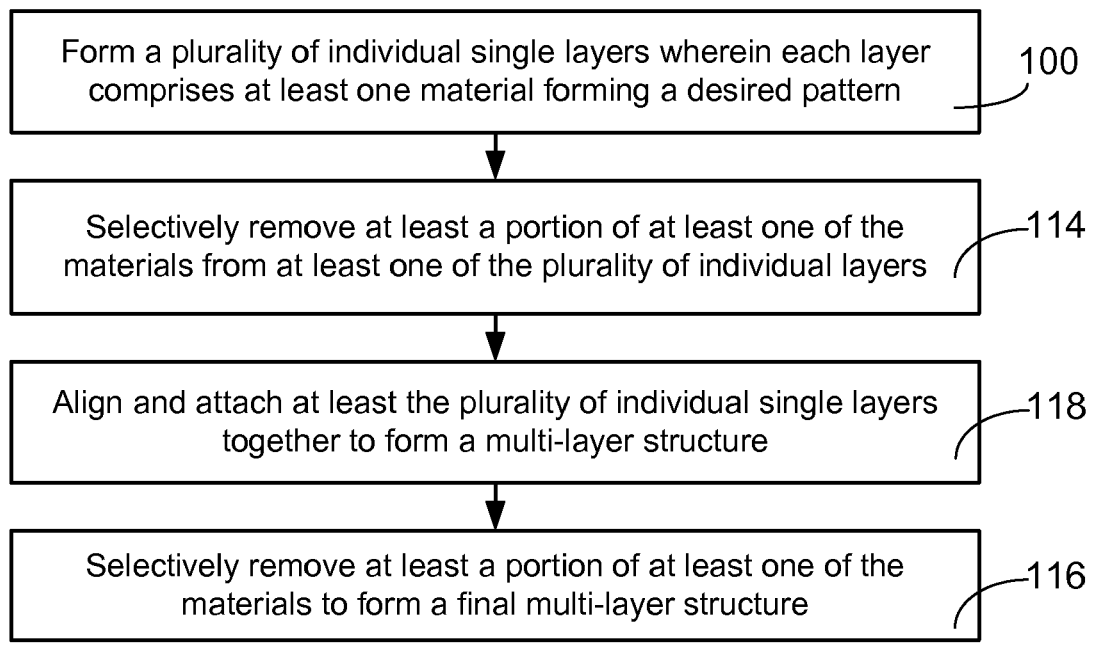
FIG. 12 provides a block diagram of a process of an eleventh variation of the first generalized embodiment of FIG. 1 where a combination process of FIGS. 10 and 11 is used to form a desired multi-layer structure.

FIG. 12 provides a block diagram of a process of a eleventh variation of the first generalized embodiment of FIG. 1 where a combination process of FIGS. 10 and 11 is used to form a desired multi-layer structure.

The process of FIG. 12 calls for the operations of blocks 100, 1 14, 118 and 116, respectively, which have been discussed above.

Specific examples will be discussed to teach working principles of the first embodiment of the invention, but are not intended to limit the scope of the invention to those examples presented. Rather, the scope of the invention is intended to be set by the claims interpreted in view of the specification.

A first example is shown in FIGS. 13A-13C3 which schematically depict side views at various stages of a process for forming a multi-layer three-dimensional structure by attaching individual single layers according to the first embodiment of the invention where the process includes elements exemplified in the block diagrams of FIGS. 2, 3, 4, 7, 9, 11.

FIG. 13A shows three formed single layers which are layer 120, layer 122 and layer 124. Each layer comprises a sacrificial material 126 and a structural material 128. In this example, the three layers 120,122 and 124 have the same sacrificial material 126 and the same structural material 128. However, those of skill in the art will understand that there is no limitation on the number of layers; the dimensions of each layer may be the same or different; and the sacrificial material and the structural material on each layer may be different. The structural material 128 may be a metal (e.g., nickel, aluminum and titanium), an alloy (e.g., stainless steel and titanium alloys), a semiconductor material (e.g., silicon and silicon carbide), a ceramic material (e.g., alumina), a polymer (e.g., polyimide), a composite and a combination of two or more of these above materials. The sacrificial material 126 should be selected so that it can be selectively removed with no damage or minor but acceptable damage on the structural material 128. For example, if a stainless steel is used as a structural material, copper can be selected to be a sacrificial material as copper can be etched away from the stainless steel in an ammoniacal copper etching solution which is compatible with stainless steel. The sacrificial material 126 may be selected from metals, alloys, semiconductors, ceramics or polymers, etc.

FIG. 13A also shows that each layer includes a through hole, i.e., 130 on the layer 120,132 on the layer 122, and 134 on the layer 124. These holes function as alignment reference marks for aligning these layers so that the all three layer will be attached in a predetermined configuration. Although only one through-hole on each layer is shown in FIG. 13A, each layer may include other alignment reference marks (not shown) which may have other shapes such as square or triangle. Those of skill in the art will understand that there are other alignment methods which can also be used for this purpose.

The surfaces of the three layers need to be clean without contamination as the three layers will be attached together to form a monolithic multi-layer structure. If the surfaces are not clean and/or they contain oxide layers which need to be removed for obtaining a better adhesion between layers, a cleaning process step may be added for this purpose. Techniques suited for such cleaning are well-known in the art. For example, organic solvents or inorganic cleaning solutions such as acetone, IPA (isopropyl alcohol), or alkaline solutions can be used to remove contaminations. Acid solutions such as sulfuric acid may be used to remove oxides.

FIG. 13B shows that the three layers 120, 122 and 124 have been stacked and aligned according to the predetermined configuration with the aid of the alignment reference marks 130, 132 and 134. An alignment equipment or a precision fixture with an suitable microscope may be used for this task.

Then the stacked three layer structure 136 is attached together to form a multi-layer structure. One technique which can be used for this attaching purpose is diffusion bonding. Diffusion bonding is one of many solid-state joining processes where joining is accomplished without the need for a liquid interface (brazing) or the creation of a cast product via melting and resolidification (welding). Diffusion bonding can join metallic or non-metallic materials via atomic diffusion of elements at the joining interface. Diffusion bonding facilitates the joining of materials to produce components with no abrupt discontinuity in the microstructure and with a minimum of deformation, which is suitable for precision bonding for microfabrication. Diffusion bonding works for a wide range of materials including but not limited to metals, alloys, semiconductors and ceramics. Some examples include alumina-copper, molybdenum-molybdenum, nickel-nickel, and crystal quartz-stainless steel. If silicon is the structural material 128, silicon direct bonding or fusion bonding can be used. There are commercial silicon bonding equipment available for MEMS and microelectronics fabrication. The conditions and requirements of diffusion bonding and silicon fusion bonding can be obtained from handbooks, papers on professional journals, patents, and those of skill in the art. Although FIG. 13B shows that the three layers 120, 122 and 124 are to be attached together simultaneously, these three layers may also be attached together one by one.

FIG. 13C1 shows a free-standing multi-layer three-dimensional structure 138 after the layers 120,122 and 124 have been attached and the sacrificial material 126 has been removed. Chemical etching or electrochemical etching can be used to dissolve the sacrificial material 126 in a proper etchant solution. In some cases, for the further protection of the structural material 128 (e.g., a metal or an alloy) in the etchant solution, proper corrosion inhibitors may be added to protect the structural material 128. Corrosion inhibitors should be selected to protect the structural material, but not influence the etching of the sacrificial material. Techniques for metal protection with corrosion inhibitors are generally known in the art.

FIG. 13C1 shows the free-standing multi-layer three-dimensional structure 138. Alternatively, the layers 120, 122 and 124 may be attached to a substrate. The attaching operation may be done by attaching the three layers and the substrate at the same time via, e.g., diffusion bonding. The attaching operation may also be done by first attaching the three layers together and then attaching the attached three layers to the substrate via, e.g., diffusion bonding, using an adhesion material, or the like. Still the attaching operation may be done by first attaching the three layers together, then etching a portion of or all of the sacrificial material 126, and finally attaching the three layer structure to the substrate. Note that a substrate in the present invention may be a pure substrate the material of which is either the same as or different from the structural material 128, or a substrate comprising other components, or a device. If a pure substrate is used, after all the layers have been attached onto the substrate, the substrate may be machined to form additional structures on it before or after removing sacrificial material 126.

FIG. 13C2 shows that the three layers 120,122 and 124 have been attached on a substrate 142 and the sacrificial material 126 has been etched. Therefore, a three-layer structure 140 is formed on the substrate 142. The substrate 142 may be a metal, a semiconductor material, a ceramic material or an other suitable material. The substrate 142 may be solid or porous. The substrate 142 may be so large that it can accept other structures such as multi-layer structures.

Further alternatively, instead of attaching multi-layer structures on one side of a substrate, the other side of the substrate may also be used as a base to accept multi-layer structures. FIG. 13C3 shows that one multi-layer structure 140 is attached on the top surface of the substrate 142 while another same structure 144 is attached on the bottom surface of the substrate 142.

Optionally, fabricated multi-layer three-dimensional structures may be post-treated for the enhancement of their performances or for the protection from their various service environments. For example, because of its high electrical conductivity, copper microstructures serve as RF (Radio Frequency) MEMS components. However, copper can be easily oxidized or corroded. To protect copper from oxidation and corrosion, copper structures may be dipped in a copper surface treatment solution containing copper corrosion inhibitors to form a protective coating on copper surfaces. For example, benzotriazole (BTA, $C_6H_4N_3H$) is one of the most effective inhibitors for copper, which can form a thin (<50 Å) protective polymeric film on copper. So the formed coating will only take neglectable copper real-estate from copper microstructures and will also not influence microdevice functions. A suitable treatment solution may contain at least 1 ppm BTA. A preferred concentration range by weight for BTA is from 0.05% to 1%. Copper structures may be treated in one of such solutions in a preferred temperature range of 20-50° C. for at least 30 seconds. Those of skill in the art will understand that there are other copper inhibitors (either in same chemical class or in different chemical classes) for copper surface treatment.

Metal medical microdevices made of stainless steel, Nitinol (a NiTi alloy) or titanium and its alloys may need to be surface treated for better services. For example, stainless steel or Nitinol coronary stents need to be chemically or electrochemically polished to obtain smooth surfaces for reducing thrombogenicity, be anodized to form thick and dense oxide films for reaching better corrosion performance and biocompatibility, and/or be coated a layer of tantalum for improving radiopacity.

Although Nitinol or NiTi alloys are biocompatible materials, there are still concerns regarding nickel ions released from NiTi alloys into human bodies. One method to prevent from this nickel problem is to selectively etch nickel on the surface of the NiTi structure so that the amount of nickel on the surface is significantly decreased and the surface consists essentially of titanium while the body of the structure is still the normal NiTi alloy. Selective chemical or electrochemical etching may be used to remove nickel. For example, a NiTi structure may be immersed in a chemical etchant solution such as a suitable nickel etchant until surface nickel is partially or completely dissolved. A formulated nickel chemical etchant solution should not dissolve or insignificantly dissolve titanium. If necessary, a suitable titanium corrosion inhibitor may be added in the solution to protect titanium. Electrochemical etching may be also used for this purpose. In this case, a NiTi structure acts as an anode and is immersed in a suitable chemical solution (e.g., 5% (volume) sulfuric acid). Either a suitable current or voltage is applied between the anode and a cathode such as a noble metal electrode. The resulting anodic current dissolves nickel, but not titanium or at least not significantly.

For aluminum or aluminum alloy microdevices, aluminum anodization is an excellent surface modification method for forming insulating protective aluminum oxide films.

A second example is shown in FIGS. 14A-14D which schematically depict side views at various stages of a process for forming a multi-layer three-dimensional structure by attaching two individual single layers and one individual group of two layers according to the first embodiment of the invention where the process includes elements exemplified in the block diagrams of FIGS. 2, 3, 4, 5, 7, 9, 11.

Figure 14A:
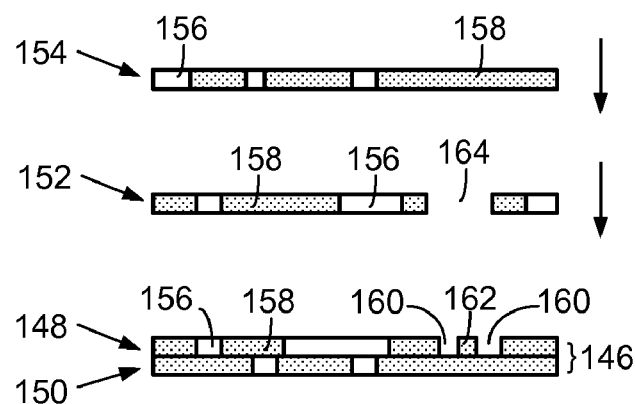
FIGS. 14A-14D schematically depict side views at various stages of a second example of a process for forming a multi-layer three-dimensional structure by attaching two individual single layers and one individual groups of two layers according to the first embodiment of the invention where the process includes elements exemplified in the block diagrams of FIGS. 2, 3, 4, 5, 7, 9, 11.

FIG. 14A shows a group of two layers 146 which has a top-layer 148 and a bottom-layer 150, and two single layers 152 and 154. Each layer contains a sacrificial material 156 and a structural material 158. In this example, all the layers (148, 150, 152, 154) have the same sacrificial material 156 and the same structural material 158. Layer groups comprising more than one layer may be formed by attaching (e.g., diffusion bonding) individual single layers, by attaching individual single layers and individual sub-groups of layers, by building layers successively (i.e., layer-by-layer stacking), or by using various combinations of the above approaches. In this example, the top-layer 148 has a circular (a closed shape) opening 160 extending from the top surface of the top-layer 148 through the thickness of the top-layer 148 to the top surface of the bottom-layer 150. There is a structural feature 162 in the opening 160 sitting on the top surface of the bottom-layer 150. One purpose of this example is to illustrate how to make a multi-layer three-dimensional structure comprising at least one sealed cavity or hollow. The feature 162 is isolated or disconnected from the rest of the layer 148. Note that a sacrificial material is usually used to combine all structural components or features on a layer together. But in the case of building sealed cavities, a sacrificial material cannot be used to combine isolated features in the cavities with other features as the sacrificial material cannot be etched away from the formed sealed cavities. To support the isolated feature 162, the layer 148 is thus built on the layer 150. It is the layer 150 that supports the isolated feature 162. This example reveals one reason why groups of layers are needed to build multi-layer three-dimensional structures in addition to just using individual single layers. Another reason for using groups of layers is that it may be more cost-effective for forming groups of layers than forming single layers in some cases. The layer 152 comprises a through opening 164 (circular or other closed shapes) which is a portion of the sealed cavity to be formed.

Figure 14B:
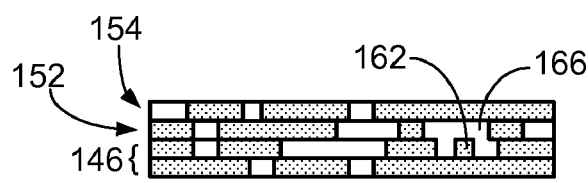

FIG. 14B shows that the three components 146, 152 and 154 have been stacked and aligned according to the predetermined configuration with the aid of alignment reference marks (not shown).

Figure 14C:
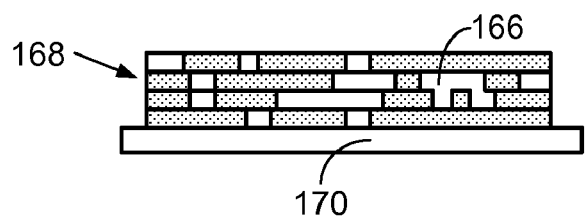

FIG. 14C shows that the three components 146, 152 and 154, and a substrate 170 have been attached together via, e.g., diffusion bonding or the like. Note that the structure 168 now comprises a sealed cavity 166.

Figure 14D:
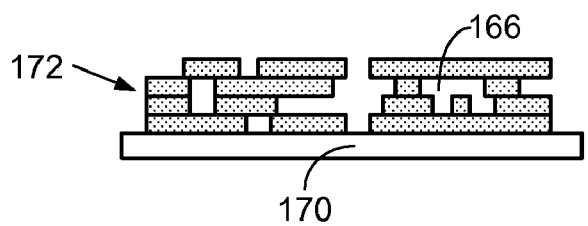

FIG. 14D shows a final multi-layer three-dimensional structure 172 comprising the sealed cavity 166 after the sacrificial material 156 has been etched.

A third example is shown in FIGS. 15A-15E which schematically depict side views at various stages of a process for forming a multi-layer three-dimensional silicon structure by attaching individual single layers where a portion of at least one material of each layer is removed prior to the attaching operation according to the first embodiment of the invention where the process includes elements exemplified in the block diagrams of FIGS. 2, 3, 4, 6, 8, 9, 10, 12.

Figure 15A:
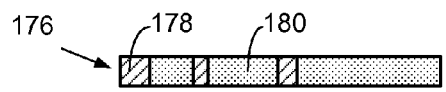
FIGS. 15A-15E schematically depict side views at various stages of a third example of a process for forming a multi-layer three-dimensional silicon structure by attaching individual single layers where a portion of at least one material of each layer is removed prior to the attaching operation according to the first embodiment of the invention where the process includes elements exemplified in the block diagrams of FIGS. 2, 3, 4, 6, 8, 9, 10, 12.
Figure 15A:
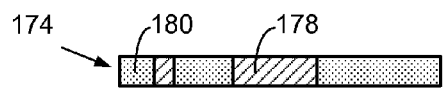
Figure 15A:
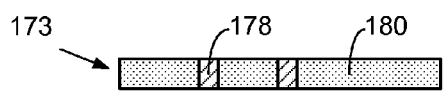

FIG. 15A shows three formed single layers which are 173, 174 and 176. Each layer comprises a sacrificial material 178 (e.g., copper or nickel-tungsten (NiW) alloy) and a structural material 180 that is silicon. Copper or NiW may be an electrodeposited material. For example, copper may be made with electrodeposition from an acid copper plating bath such as the Cu—U bath manufactured by Technic Inc. NiW may be made with electrodeposition from a NiW plating bath such as the ENLOY® Ni-500 bath manufactured by Enthone Inc., which produces an alloy containing approximately 65% (wt.) nickel and 35% (wt.) tungsten. The structural silicon may be doped with a dopant (e.g., boron, phosphorus, arsenic, antimony, etc) or may not be doped.

Figure 15B:
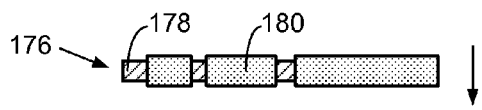
Figure 15B:
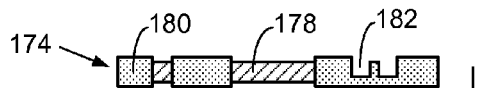
Figure 15B:
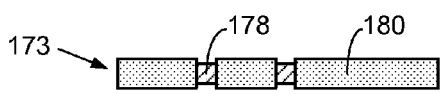

FIG. 15B shows that a portion of the sacrificial material 178 on the three layers has been etched so that the surfaces of the sacrificial material 178 moves inwards. Therefore, the sacrificial material 178 on each layer is thinner than the structural material silicon 180. In addition, the surface levels of the sacrificial material 178 are below the surface levels of the structural material 180. Therefore, the surfaces of the sacrificial material 178 will not be involved during attaching as they will not contact other surfaces. In fact, our purpose is to attach the structural material components on each layer together. If we can leave out the sacrificial material 178, it may simplify an attaching process such as diffusion bonding. In addition, the total bonding area is reduced due to the non-involvement of the sacrificial material 178. Diffusion bonding needs to apply a suitable pressure on the layers. If the total bonding area decreases, the required bonding force will decrease accordingly.

The sacrificial material 178 may be removed by using chemical etching, electrochemical etching or the like. For example, copper may be etched in an ammoniacal copper etching solution such as Enstrip C-38 manufactured by Enthone Inc.

NiW alloys may be etched by at least two chemical etching solutions. One suitable solution comprises at least a complexing agent such as ammonium ions such as ammonium hydroxide and an oxidizing agent such as chlorite such as sodium chlorite, nitrite such as sodium nitrite, and nitrate such as sodium nitrate. One suitable such NiW etching solution comprises ammonium hydroxide and sodium chlorite. To facilitate to mix a such solution, we may first make a chlorite solution, e.g., 30% (wt.) sodium chlorite. To mix an etching solution, we can take a certain volume of ammonium hydroxide (29% NH$_3$), a certain volume of sodium chlorite (30%), and a certain volume of water such as DI (deionized) water if needed. In a 100 ml solution, ammonium hydroxide may be in the range from 5 ml to 95 ml and sodium chlorite may be in the range from 5 ml to 95 ml. A preferred solution (100 ml) has 50-90 ml of ammonium hydroxide and 10-50 ml of sodium chlorite. The solution temperature during etching may be in the range from 0 to 100° C. A preferred solution temperature is from 20 to 40° C.

Another suitable NiW etching solution may be selected from nickel etching solutions, preferably, from the nickel etching solutions comprising at least a nitro compound such as M-nitro benzoic acid and sodium M-nitrobenzoate, and a complexing agent such as ethylenediamine. A typical such solution is list as follows.

| Nitro compound | 35–40 g/l |
| ethylenediamine | 60–70 g/l |
| Etching Temperature | 20–90° C. |

This nitro-compound type of nickel etchant has commercial products available such as B-9 Nickel Strippers manufactured by MetalX, Inc and ROSTRIP Nickel Stripper M-7 manufactured by Atotech USA Inc. Note that all these products are used only for etching or stripping electrolytic and electroless nickel deposits. But in the present invention, they may be used for etching NiW.

The layer 174 in FIG. 15B also comprises a blind via 182. The blind via can be micromachined on the structural material silicon by DRIE (Deep Reactive Ion Etching), laser micromachining, chemical or electrochemical etching, micro-electrodischarge machining or the like. This example teaches that layers for constructing multi-layer three-dimensional structures are not necessary to have continuous flat surfaces. Layers may have through openings or blind openings as long as these openings do not disintegrate the layers.

Figure 15C:
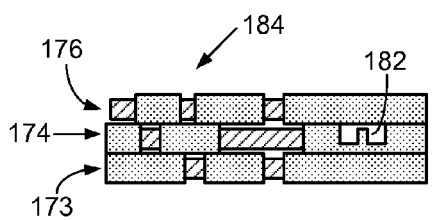

FIG. 15C shows that the three layers 173, 174 and 176 have been aligned and attached. The three layers 173, 174 and 176 may be attached via using silicon direct bonding or fusing bonding.

Direct silicon wafer bonding has become a standard MEMS technology. Some MEMS equipment manufacturers such as EV Group supply aligned wafer bonding systems which have a bonder aligner for performing alignment and a vacuum bond chamber for bonding silicon wafers. Some advanced systems can handle multiple silicon wafers. It is reported that a typical alignment accuracy of ±1 μm can be achieved. As the three layers have two different materials (Si and Cu or NiW) and silicon direct wafer bonding is usually operated at high temperatures (up to 1000° C.) to achieve strong adhesion between silicon, the mismatch in the coefficient (unit: $10^{-6}$/K) of thermal expansion between the silicon (2.6) and the copper (16.5) might induce thermal stress that would distort the multi-layer structure. There are several approaches which can be employed to minimize this effect. The first approach is to use an annealing temperature as low as possible. For example, the bond can reach the strength of silicon itself in less than 5 min at 1100° C. The same strength can be obtained at 700° C., though it needs a longer time, >20 hr. The second approach is to use low temperature plasma activation bonding. With the aid of plasma activation for silicon surfaces, the bonding temperature can be dramatically decreased. High strength bonding can even be reached at room temperature. The third approach is to chemically modify silicon surface with a proper chemical such as a saline (e.g., hydrolyzed tetramethoxysilane) so that a high bonding strength can be realized at moderate temperatures. The forth approach is to use a three-step process, i.e., initial low temperature (even room temperature) bonding, etching of sacrificial material and final bonding. The strength of a silicon-silicon bond is a function of time, bonding temperature and silicon surface conditions. We can first do a very low temperature bonding using the second or the third approach discussed above. The idea is to just hold all the silicon microstructures together so that the bond can survive the etching of sacrificial material. Then etch away the sacrificial metal. Finally, strengthen the bond at a suitable high temperature. As there is no sacrificial material involved in the final high temperature bonding, thermal stress would not be a problem.

Figure 15D:
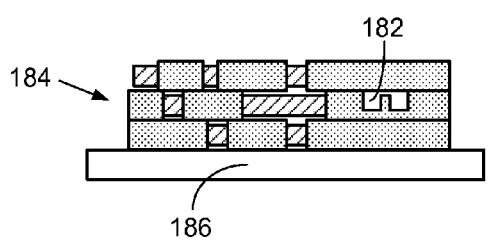

FIG. 15D shows that the bonded three layer structure 184 has been attached to a substrate 186 via various attaching techniques. For example, the multi-layer structure 184 may be attached to the substrate 186 with an adhesive. If the substrata 186 is glass, anodic bonding may be used to bond them together. If the substrate 186 is silicon, direct silicon bonding may be used. If the substrate 186 is a ceramic such as alumina, diffusion bonding may be used. Note that the structure 184 contains a sealed cavity 182. This example reveals another way to make sealed cavities by micromachining a structural material to form a through or blind via instead of using the two-layer approach discussed above in the second example.

Figure 15E:
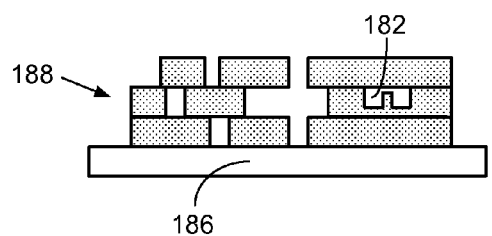

FIG. 15E shows a final multi-layer three-dimensional structure 188 comprising the sealed cavity 182 on the substrate 186 after the sacrificial material 178 has been etched. Again, if the sacrificial material is copper, an ammoniacal copper etching solution such as Enstrip C-38 (Enthone Inc.) may be used for this purpose. If the sacrificial material is NiW, either of the two chemical etching solutions discussed in FIG. 15B may be used.

The above specific examples are intended to illustrate the working principles of the first embodiment of the invention. Various other implementations of the first embodiment of the present invention exist. Various other alternatives and modifications will be apparent to those of skill in the art upon review of the teachings herein. Further implementations and alternatives are possible by combining the teachings disclosed explicitly herein.

The unique advantages of the first embodiment of the present invention are described as follows.

Firstly, as this disclosed embodiment of the invention is a parallel process (i.e., all required single layers can be fabricated separately and simultaneously), we do not need to build all the layers consecutively for constructing a multi-layer three-dimensional structure. We may also attach them all together simultaneously. Therefore the production speed can be greatly increased.

Secondly, as we now only need to produce individual single layers or individual groups of layers (usually several layers), the fabrication process can be much more easily controlled. Moreover, with this invention, we can mass produce the copies of the layers. Only quality-approved layers will be used for final attaching. Thus the production yield will also be greatly improved.

Thirdly, this embodiment of the invention gives us a number of flexibilities. For example, the dimensions of each layer may be the same or different. The materials on each layer may be the same, some same and some different or totally different. Layers are not necessary to have continuous flat surfaces. Layers may have through openings or blind openings as long as these openings do not disintegrate the layers. Layers may only have one material forming a pattern. A multi-layer structure may comprise one or more seal cavities. A substrate may be solid or porous. A substrate may be machined to form additional structures either before or after a multi-layer structure is attached to the substrate. A substrate may accept a plurality of multi-layer structures either on one side or both sides of the substrate.

Fourthly, in contrast with the multi-layer electrochemical fabrication methods, this invention can use bulk materials as structural materials. Although a small portion of materials can be made practically and cost-effectively with electrochemical deposition, in some cases, it may prefer to use bulk materials as their material properties are better than the ones of their corresponding materials made with electrochemical deposition. With using bulk materials, lots of new material structures can be made. We now can build three-dimensional meso and micro-structures of stainless steel, titanium and its alloys, silicon, silicon carbide, and even non-metal materials, which are impossible to be made by using the known three-dimensional fabrication techniques. New applications can be found in microsensors, micromedical devices, lab-on-chip devices, micro-electronic devices, MEMS devices, to just name few. In addition, with using bulk materials, layer thickness will not be an issue as commercial bulk materials with various thicknesses can be selected to meet different thickness requirements for the fabrication of three-dimensional structures. Alternatively, we can also machine bulk materials to obtain required thicknesses.

Lastly, still in contrast with the multi-layer electrochemical fabrication methods, this invention can produce three-dimensional meso and micro-structures comprising sealed cavities. So this invention can make complex three-dimensional structures.

Figure 16:
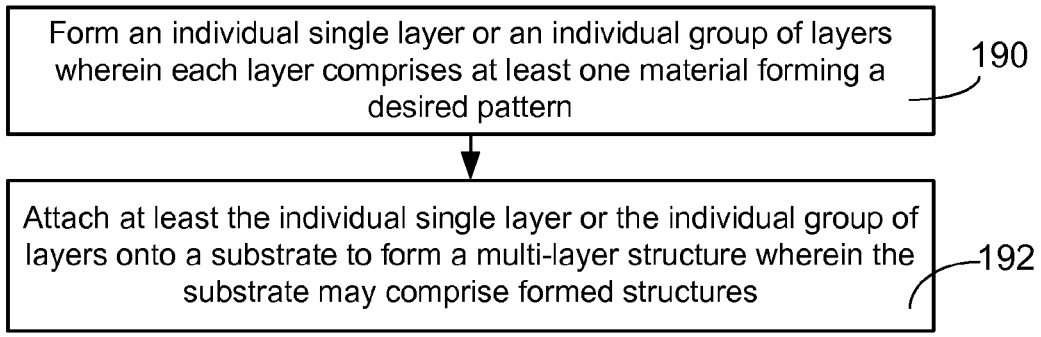
FIG. 16 provides a block diagram of a process of a first variation of the second embodiment of the present invention where a multi-layer structure is formed via attaching an individual single layer or an individual group of layers to a substrate which may comprise formed structures.
Figure 17:
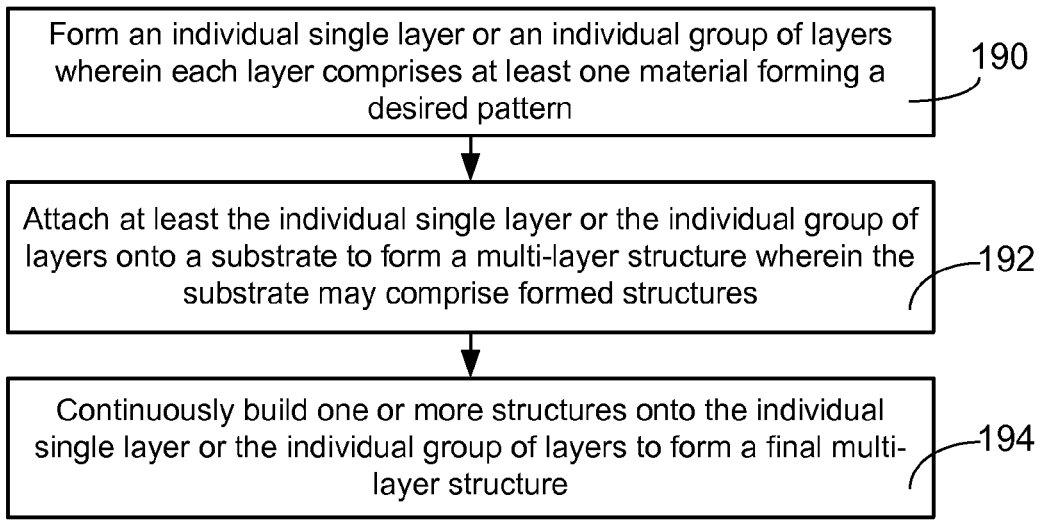
FIG. 17 provides a block diagram of a process of a second variation of the second embodiment of the present invention where other structures are continuously built onto the attached individual single layer or individual group of layers to form a final multi-layer structure after an individual single layer or individual group of layers is attached to a substrate which may comprise formed structures.
Figure 18:
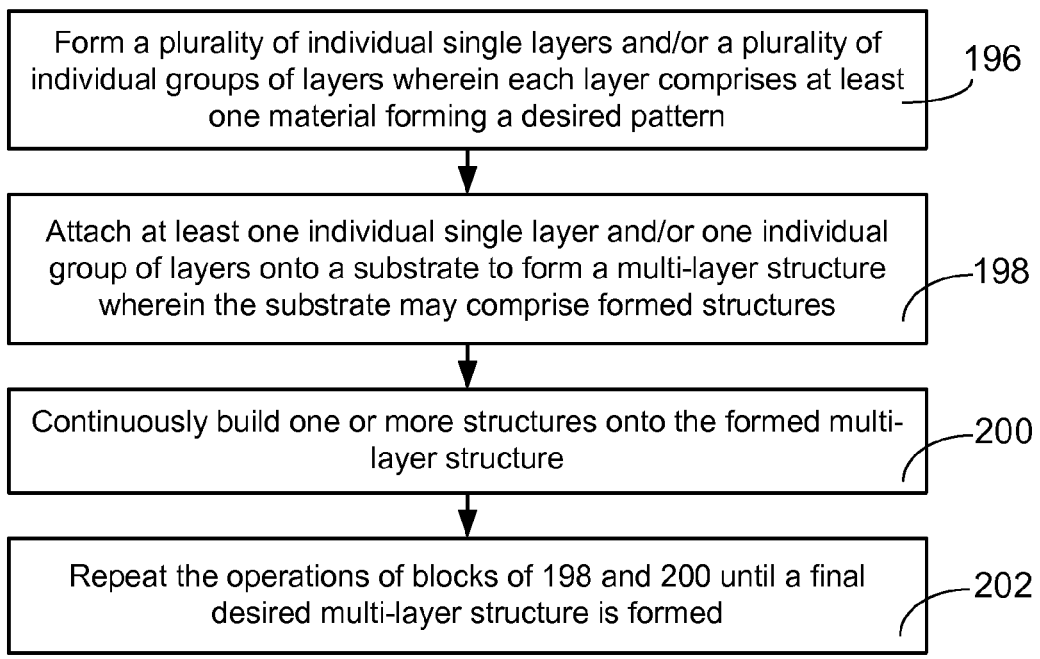
FIG. 18 provides a block diagram of a process of a third variation of the second embodiment of the present invention where a plurality of individual single layers and/or a plurality of individual groups of layers are used to form multi-layer structures instead of using only one individual single layer and/or one individual group of layers described above in FIGS. 16 and 17.

FIGS. 16-18 provides three block diagrams of three processes which compose a second generalized embodiment of the present invention where at least one individual single layer and/or at least one individual group of layers are attached to a substrate which may comprise formed structures. Additionally, structure building may continue on the attached layer or layers.

FIG. 16 provides a block diagram of a process of a first variation of the second embodiment of the present invention where a multi-layer structure is formed via attaching an individual single layer or an individual group of layers to a substrate which may comprise formed structures.

Block 190 calls for forming an individual single layer or an individual group of layers where each layer comprises at least one material forming a desired pattern. The individual single layer or the individual group of layers comprises at least two materials, one of which is a sacrificial material and the other of which is a structural material. The functions of sacrificial material has been discussed in the first generalized embodiment. Various processes for building individual single layers will be described in detail hereinafter in the third embodiment of the invention. An individual group of layers may be fabricated by attaching individual single layers together as discussed above in first embodiment of the invention. An individual group of layers may also be fabricated by using a successive building technique which will be described in detail hereinafter in the fourth embodiment of the invention. Still an individual group of layers may be fabricated by using either of the methods disclosed in U.S. Pat. No. 5,190,637 issued on Apr. 24, 1992 to Henry Guckel and U.S. Pat. No. 6,027,630 issued on Feb. 22, 2000 to Adam Cohen.

Block 192 calls for attaching at least the individual single layer or the individual group of layers onto a substrate to form a multi-layer structure where the substrate may comprise formed structures. A substrate may be a pure substrate without any structures. A substrate may also be a substrate comprising formed structures, for example, a substrate has a multi-layer structure on it, which is built by using either the Henry Guckel's method or Adam Cohen's method. Attaching techniques have been discussed above in the first embodiment.

FIG. 17 provides a block diagram of a process of a second variation of the second embodiment of the present invention where other structures are continuously built onto the attached individual single layer or individual group of layers to form a final multi-layer structure after an individual single layer or individual group of layers is attached to a substrate which may comprise formed structures.

The process of FIG. 17 begins with the operations of block 190 and 192 as discussed above and thereafter proceeds to block 194.

Block 194 of FIG. 17 calls for continuously building other structures onto the attached individual single layer or the individual group of layers to form a final multi-layer structure. Various other meso- or micro-structures may be manufactured by using various micro-fabrication techniques known to those skilled in the art. For example, either the Henry Guckel's method or Adam Cohen's method may be applied to build further multi-layer structures.

FIG. 18 provides a block diagram of a process of a third variation of the second embodiment of the present invention where a plurality of individual single layers and/or a plurality of individual groups of layers are used to form multi-layer structures instead of using only one individual single layer and/or one individual group of layers described above in FIGS. 16 and 17.

Block 196 calls for forming a plurality of individual single layers and/or a plurality of individual groups of layers where each layer comprises at least one material forming a desired pattern. Each layer comprises at least one structural material. At least one of the plurality of individual single layers comprises at least one sacrificial material. At least one of the plurality of individual groups of layers comprises at least one sacrificial material.

Block 198 calls for attaching at least one of the plurality of individual single layers and/or at least one of the individual groups of layers onto a substrate to form a multi-layer structure where the substrate may comprise formed structures. During this operation, the at least one individual single layer and/or the at least one individual group of layers may be attached to the different regions of the substrate. The layer or layers may also be attached onto the previously attached layer or layers. Note that after the layer or layers have been bonded to a substrate the whole structure becomes a new substrate onto which following structures may be built on the new attached layer or layers and/or other regions of the original substrate.

Block 200 calls for continuously building required structures onto the formed new substrate.

Block 202 calls for repeating the operations of blocks of 198 and 200 until a final desired multi-layer structure is formed.

It should be understood that the various features and alternatives presented above in association with the processes of FIGS. 1-15, mutatis mutandis, may be applied to form variations to the processes of FIGS. 16-18 and vice-a-versa. For example, an individual single layer may be etched to remove at least a portion of at least one of the materials before it is attached to a substrate. A layer may need to be aligned to alignment reference marks or features on a substrate onto which the layer will be attached. After a final multi-layer structure is formed, at least a portion of at least one material (e.g., sacrificial material) of the multi-layer structure is removed.

A specific example will be discussed to teach working principles of the second embodiment of the invention, but are not intended to limit the scope of the invention to this implementation presented.

The example is shown in FIGS. 19A-19F which schematically depict side views at various stages of a process for forming a multi-layer three-dimensional structure according to the second embodiment of the invention where the process includes elements exemplified in the block diagrams of FIGS. 16-18.

Figure 19A:
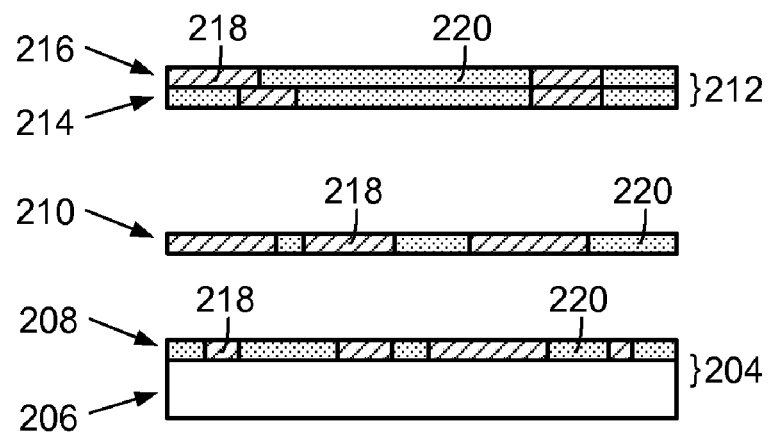
FIGS. 19A-19F schematically depict side views at various stages of an example of a process for forming a multi-layer three-dimensional structure according to the second embodiment of the invention where the process includes elements exemplified in the block diagrams of FIGS. 16-18.

FIG. 19A shows a substrate 204 which has a base 206 and a layer 208 built on the base 206, an individual single layer 210 and a two-layer group 212 which has a bottom layer 214 and a top layer 216. All layers (208, 210, 214 and 216) comprise two materials, a sacrificial material 218 and a structural material 220. These two materials on each layer form a desired pattern. Substrate 204, individual single layer 210 and two-layer group 212 may be formed with various processes which either have been discussed above or will be discussed hereinafter.

Figure 19B:
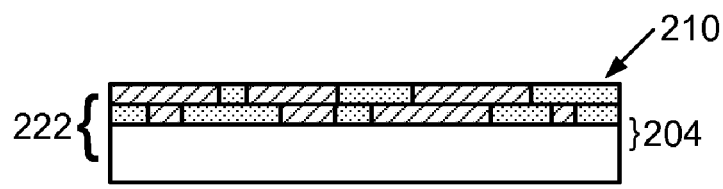

In FIG. 19B, the individual single layer 210 has been attached to the top surface of the layer 208 of the substrate 204 via, e.g., diffusion bonding so that a new substrate 222 is formed.

Figure 19C:
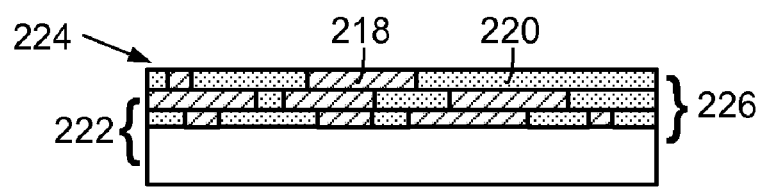

In FIG. 19C, a new layer 224 has been built on the top surface of the layer 210 of the substrate 222 via, e.g., either the Henry Guckel's method or Adam Cohen's method. The layer 224 comprises a sacrificial material 218 and a structural material 220 which comprise a desired pattern. After this operation, a new substrate 226 is formed.

Figure 19D:
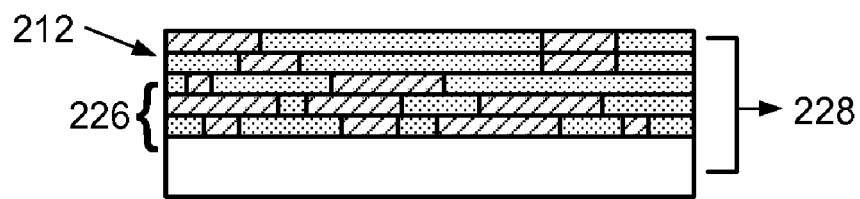

In FIG. 19D, the two-layer group 212 has been attached to the top surface of the layer 224 of the substrate 226 via, e.g., diffusion bonding so that a new substrate 228 is formed.

Figure 19E:
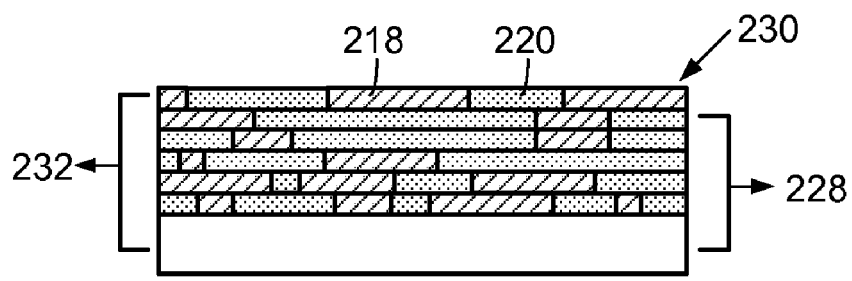

In FIG. 19E, a new layer 230 has been built on the top surface of the layer 216 of the substrate 228 via, e.g., either the Henry Guckel's method or Adam Cohen's method. The layer 230 comprises a sacrificial material 218 and a structural material 220 which comprise a desired pattern. After this operation, a new substrate 232 is formed.

Figure 19F:
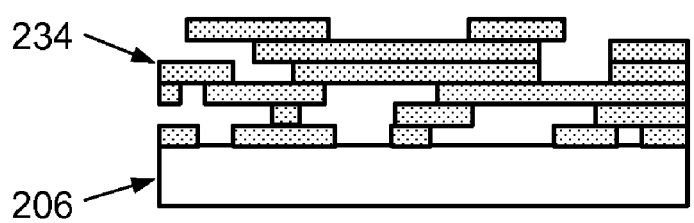

In FIG. 19F, the sacrificial material 218 has been etched via, e.g., chemical or electrochemical etching so that a final desired multi-layer three-dimensional structure 234 is formed on the base 206.

As individual single layers are unit construction blocks for building multi-layer three-dimensional structures, this present invention discloses various approaches to achieve the goal set forth in the block 100 in FIG. 1. These approaches and their variations and alternatives for making individual single layers shown in FIGS. 20-23 compose a third generalized embodiment of the prevent invention.

Figure 20:
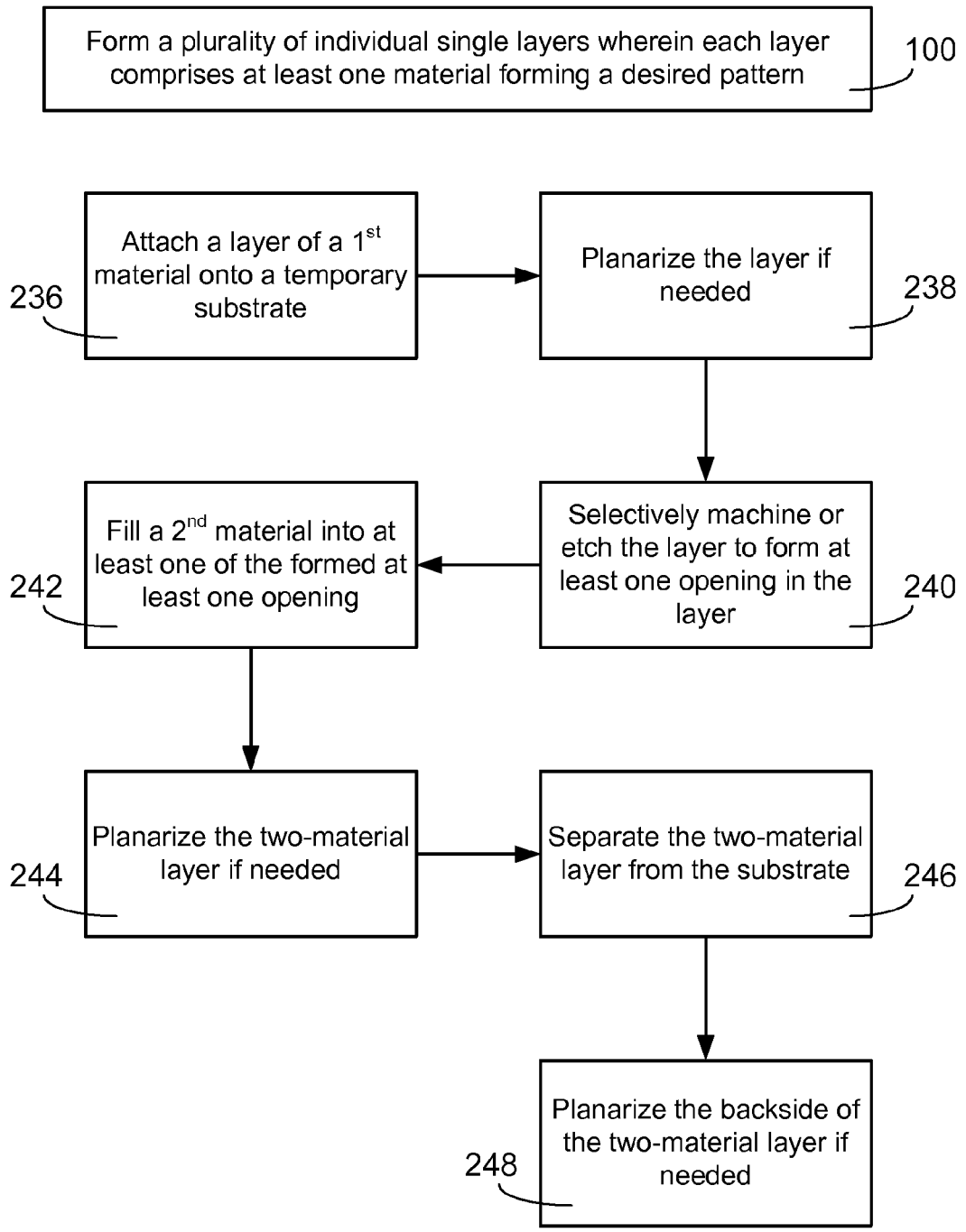
FIG. 20 provides a block diagram indicating a process of a first variation of the third embodiment for building individual single layers comprising at least two materials.

FIG. 20 provides a block diagram indicating a process of a first variation of the third embodiment for forming individual single layers comprising at least two materials. The first block 100 sets forth the goal of this process. The primary steps of this process for forming a single layer comprising two materials are shown from block 236 to block 248.

Block 236 sets forth a first step of the process which involves attaching a layer of a first material onto a temporary substrate by using diffusion bonding, direct silicon bonding, anodic bonding, adhesive bonding, laminating, rolling, cladding, vacuum, mechanical means, magnetic attraction, electrostatic attraction and the like. The function of the temporary substrate is to be a mechanical support on which a desired layer will be formed. This method is specially useful for forming thin films, flexible material layers, or hard-to-handle material layers as a thick, rigid substrate makes easy to deal with the above mentioned materials. The formed desired layer will be separated from the substrate to become a freestanding layer after it is built on the substrate. The desired layer may be directly built on the substrate and then be separated from the substrate by peeling the layer off from the substrate, machining the substrate to release the layer, dissolving the substrate, and combinations thereof. Alternatively, the desired layer may be built on a releasing layer on the substrate. The releasing layer will be dissolved to release the desire layer after the desired layer is built on it.

Layers of various bulk material are commercially available, for example, thin metal films, metal foils, metal plates, thin polymer films or sheets, silicon wafers with a thickness in the range of 20~500 μm, SiC wafers, etc. Various material layers may be fabricated with various techniques. For example, metal layers such as foils and films may be made by using mechanical forming means (e.g., rolling), deposition means (e.g., electrochemical deposition, vacuum deposition, spray), and the like. If a layer has a suitable and uniform thickness and required surface conditions (e.g., smoothness and flatness), it may be used directly for making an individual single layer. For example, double-side polished silicon wafers may be used directly. Otherwise, additional processing steps may be needed to obtain a required layer. For example, if a layer is too thick, it can be thinned down to a required thickness. If the surface flatness and smoothness of a layer do not meet the requirements, various planarization processes may be applied, e.g., CMP (chemical-mechanical polishing), diamond lapping, grinding, diamond turning, and the like. It should be understood that even a layer of a required material is not commercially available, it may be easily obtained via custom manufacturing through suitable manufacturers.

Block 238 sets forth a second step of the process which involves planarizing the attached layer of the first material. This step is optional. This step needs to be applied if (1) the layer needs to be machined to reach a predetermined thickness, (2) the layer needs to have a uniform thickness, and/or (3) the layer surfaces need to achieve a flatness and smoothness for the following processing steps. Many machining techniques may be used for this purpose, e.g., diamond lapping, diamond turning, chemical-mechanical polishing, milling, grinding and the like.

Block 240 sets forth a third step of the process which involves selectively etching or machining the attached layer of the first material to form at least one opening in the layer. The openings may be all through (from the top side of the layer to the bottom side of the layer), all blind, or some through and some blind. The openings may be made simultaneously or via a plurality of times (successively). Selective etching or machining may be operated by using laser micromachining through a pattern mask. Selective etching may be operated by using chemical etching, electrochemical etching or DRIE (if the layer material is silicon) to the layer on which a mask material (e.g., a photoresist) is patterned so that the portion of the layer to be etched is exposed. Selective machining may also be operated by using ultrasonic machining, electrical discharge machining, drilling, cutting, and the like. Those of skill in the art understand that there are other selective etching or machining methods. Note that if we only need to make a patterned one-material layer, the process after selectively etching or machining should then move to block 246 which will be discussed later.

Block 242 sets forth a fourth step of the process which involves filling a second material into at least one of the formed at least one opening in the layer. There are many filling methods available for handling various materials. For example, electrochemical deposition such as electroplating or electroless plating may be used to fill into the openings with a depositable metal, alloy, oxide, conductive polymer, or composite. Physical deposition such as vacuum deposition (PVD, CVD, sputtering, etc.) can deposit semiconductor materials, metals and alloys. Physical deposition such as thermal and cold spray can deposit metals, alloys and ceramics. Liquid polymers may be sprayed or spread into the openings and then be solidified by use of heat, radiation or the like. Those of skill in the art understand that there are also other filling methods suitable for this purpose. Note that the second material may not be necessary to fill into all openings. For example, some of the openings may be masked so that these openings will not be filled. In some cases, this is desirable as we need one or more empty openings in the layer, e.g., as alignment reference marks. Alternatively, these empty openings may be filled into one or more other materials to form a multi-material layer by repeatedly using the method of masking and filling as discussed above.

Block 244 sets forth a fifth step of the process which involves planarizing the two-material layer. This is also an optional step. This step usually needs to be operated if at least one of the following conditions is met.

(1) The two-material layer needs to be machined to obtain a predetermined thickness;

(2) Both materials need to be exposed and both material surfaces need to be flush; and/or (3) The two-material layer surface needs to achieve predetermined flatness and smoothness.

Again, many machining techniques may be used for this purpose, e.g., diamond lapping, diamond turning, chemical-mechanical polishing, milling, grinding, and the like.

Block 246 sets forth a six step of the process which involves separating the two-material layer from the temporary substrate. This operation may be done by peeling the layer away from the substrate, machining the substrate to release the layer, dissolving the substrate, dissolving a releasing layer on the substrate, and combinations thereof. For example, if an Electrelease epoxy manufactured by EIC Laboratories, Inc. is applied on the substrate as a releasing layer, the formed layer on the epoxy releasing layer can be disbonded from the epoxy releasing layer if a small DC current is applied.

Block 248 sets forth a seventh step of the process which involves planarizing the backside surface of the layer separated from the temporary substrate. The backside surface of the layer is the surface that was attached to the substrate surface. This is also an optional step. This step usually needs to be operated if at least one of the following conditions is met.

(1) After the separation operation, the backside surface needs to achieve predetermined flatness and smoothness; or (2) If the layer comprises at least one blind opening filled with the second material, the second material in the at least one blind opening needs to be exposed on the backside surface of the layer.

To make a single layer comprising more than two materials, another approach is that the operations of the third, fourth and fifth steps may be repeated a plurality of times to fill different materials into the openings generated in the second step before the operation of the sixth and seventh steps. The six and seventh steps are then operated to separate the multi-material layer from the substrate and planarize the backside of the layer if needed. Those skill in the art will understand that single layers may have discontinuous flat surfaces (e.g., comprising through openings or blind openings made by micromachining the layer).

To make an individual group of layers comprising at least two layers, the operation steps (the first, second, third, fourth and fifth steps) discussed above may be repeated a plurality of times before the operations of the sixth and seventh steps. The sixth and seventh steps are then operated to separate the individual group of multi-material layers from the substrate. Alternatively, single layers can be attached together to form an individual group of layers. Those skill in the art will understand that the layers in the group may have many variations. For example, the layers may all have the same dimensions or different dimensions. Some of the layers may have the same dimensions. Each layer in the group may comprise the same number of materials or different number of materials. Each layer may comprise the same materials, some the same and some different materials, or totally different materials. All or some of the layers may have discontinuous flat surfaces (e.g., comprising through openings or blind openings such as the layer 148 and 152 shown in FIG. 14A and the layer 174 in FIG. 15B).

If a formed single layer or an individual group of layers is curved after separation due to, e.g., the effect of stress. A proper flattening process via pressing, rolling, heating, or the like or combination thereof may be used to make a curved single layer or a group of layers flat.

Figure 21:
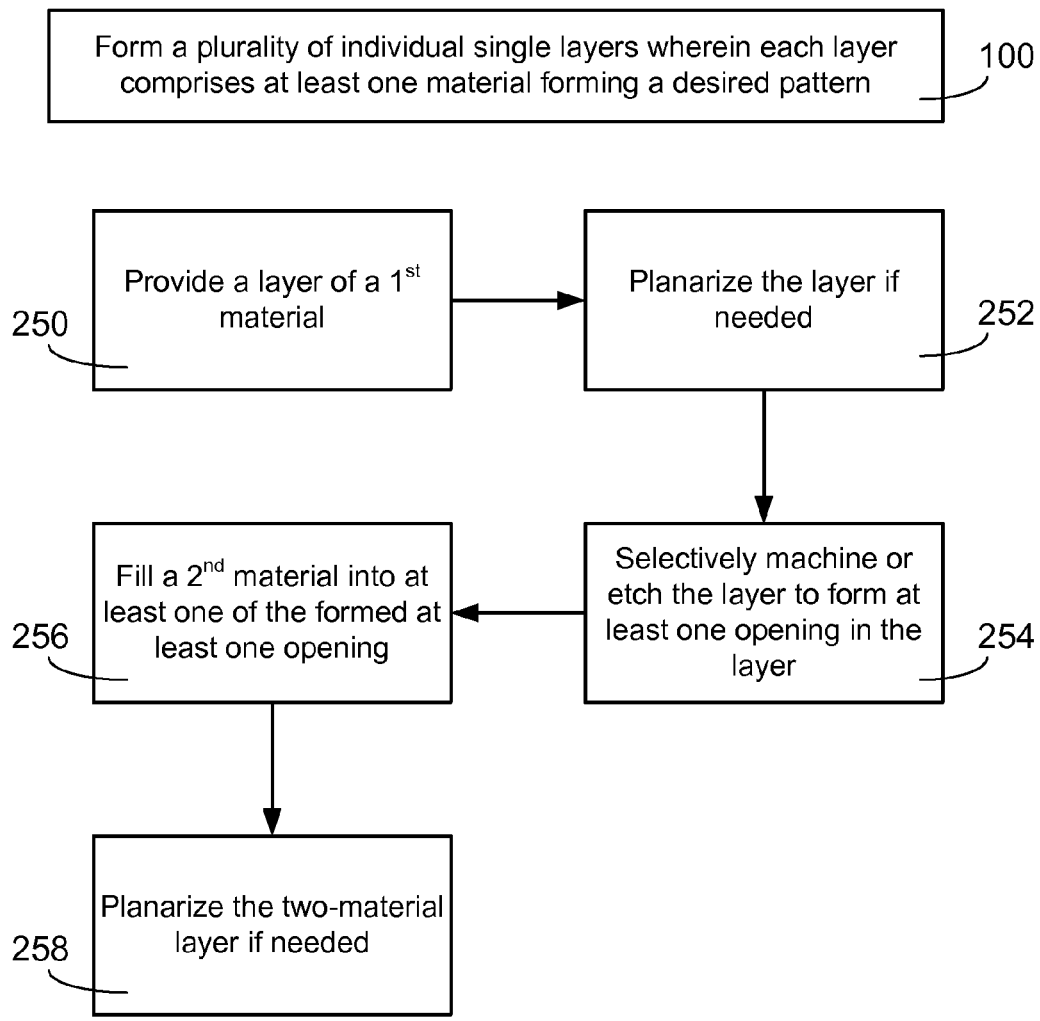
FIG. 21 provides a block diagram indicating a process of a second variation of the third embodiment for building individual single layers comprising at least two materials.

FIG. 21 provides a block diagram indicating a process of a second variation of the third embodiment for building individual single layers comprising at least two materials. The first block 100 sets forth the goal of this process. The primary steps of this process for forming a single layer comprising two materials are shown from block 250 to block 258.

Block 250 sets forth a first step of the process which involves providing a layer of a first material. Unlike block 236 in FIG. 20, block 250 does not call for attaching the layer to a temporary substrate. This is because some layers of materials are rigid and/or not hard to handle. Thus a temporary substrate may not be necessary for those layers of materials. For example, a silicon wafer with a thickness more than 200 μm is rigid enough without needing the aid of a temporary substrate. In some cases, even a thick layer of a material may be used. It can be thinned down to a required thickness after at least a second material is filled into the openings formed in this thick layer.

Block 252 sets forth a second step of the process which involves planarizing the layer of the first material. This step is optional. This step needs to be applied if (1) the layer needs to be machined to reach a predetermined thickness, (2) the layer needs to have a uniform thickness, and/or (3) the layer surfaces need to achieve flatness and smoothness for the following processing steps. In the case of using a double-side polished silicon wafer, this step may be skipped.

Blocks 254 (a third step) and 256 (a fourth step) are similar to blocks 240 and 242, respectively, as block 254 calls for selectively machining or etching the layer to form at least one opening in the layer and block 256 calls for filling a second material into at least one formed opening.

Block 258 sets forth a fifth step of the process which involves planarizing the layer. This is also an optional step. This step usually needs to be operated for the frontside surface and/or backside surface of the layer if at least one of the following condition is met.

(1) After the operations of the third and fourth steps, the frontside surface and/or backside surface needs to achieve predetermined flatness and smoothness;

(2) If the layer comprises at least one blind opening, the second material in the at least one blind opening needs to be exposed on the backside surface of the layer;

(3) The layer needs to be machined to reach a predetermined thickness; and/or (4) Both materials need to be exposed and both material surfaces need to be flush on either side of the layer or on both sides of the layer.

It should be understood that the various features and alternatives presented above in association with the process of FIG. 20, mutatis mutandis, may be applied to form variations to the process of FIG. 21 and vice-a-versa.

Figure 22:
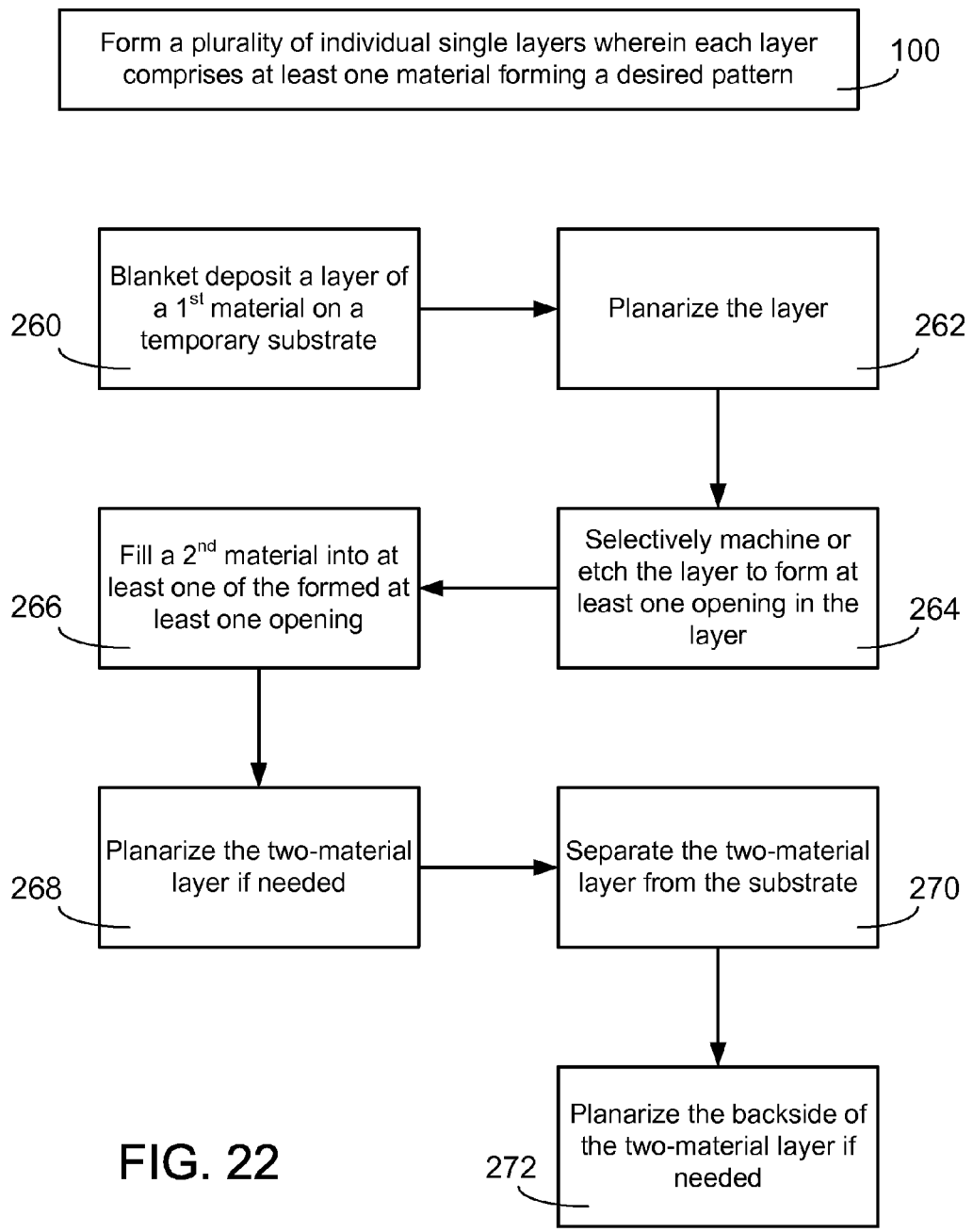
FIG. 22 provides a block diagram indicating a process of a third variation of the third embodiment for building individual single layers comprising at least two materials.

FIG. 22 provides a block diagram indicating a process of a third variation of the third embodiment for building individual single layers comprising at least two materials. The first block 100 sets forth the goal of this process. The primary steps of this process for forming a single layer comprising two materials are shown from block 260 to block 272. This process is similar to the process of FIG. 20 with the exception that a layer of a first material is deposited instead of being attached.

Block 260 sets forth a first step of the process which involves blanket depositing a layer of a $1^{st}$ material onto a temporary substrate by various deposition methods. For example, electrochemical deposition such as electroplating or electroless plating may be used to produce metals, alloys, oxides, conductive polymers, or composites. Physical deposition such as vacuum deposition (PVD, CVD, sputtering, and the like) can deposit semiconductor materials, metals and alloys. Physical deposition such as thermal and cold spray can deposit metals, alloys and ceramics. Liquid polymers may be sprayed or spread and then be solidified by use of heat, radiation or the like. Those of skill in the art will understand that there are also other deposition methods suitable for this purpose. The thickness of the deposited layer should be thick enough to meet the requirements of the following process steps.

Block 262 sets forth a second step of the process which involves planarizing the deposited layer so that the layer has a flat and smooth surface, and a predetermined thickness. Various methods may be selected for this purpose such as diamond lapping, diamond polishing, CMP, diamond turning, milling, grinding, and the like.

Blocks 264-272 are similar to blocks 240-248 of the process of FIG. 20.

Block 264 sets forth a third step of the process which involves selectively machining or etching the deposited layer of the first material to form at least one opening in the layer.

Block 266 sets forth a fourth step of the process which involves filling a second material into at least one formed opening in the layer.

Block 268 sets forth a fifth step of the process which involves planarizing the two-material layer if needed.

Block 270 sets forth a sixth step of the process which involves separating the two-material layer from the temporary substrate.

Block 272 sets forth a seventh step of the process which involves planarizing the backside surface of the two-material layer if needed. The backside surface is the surface that was attached on the substrate surface.

It should be understood that the various features and alternatives presented above in association with the processes of FIGS. 20-21, mutatis mutandis, may be applied to form variations to the process of FIG. 22 and vice-a-versa.

Figure 23:
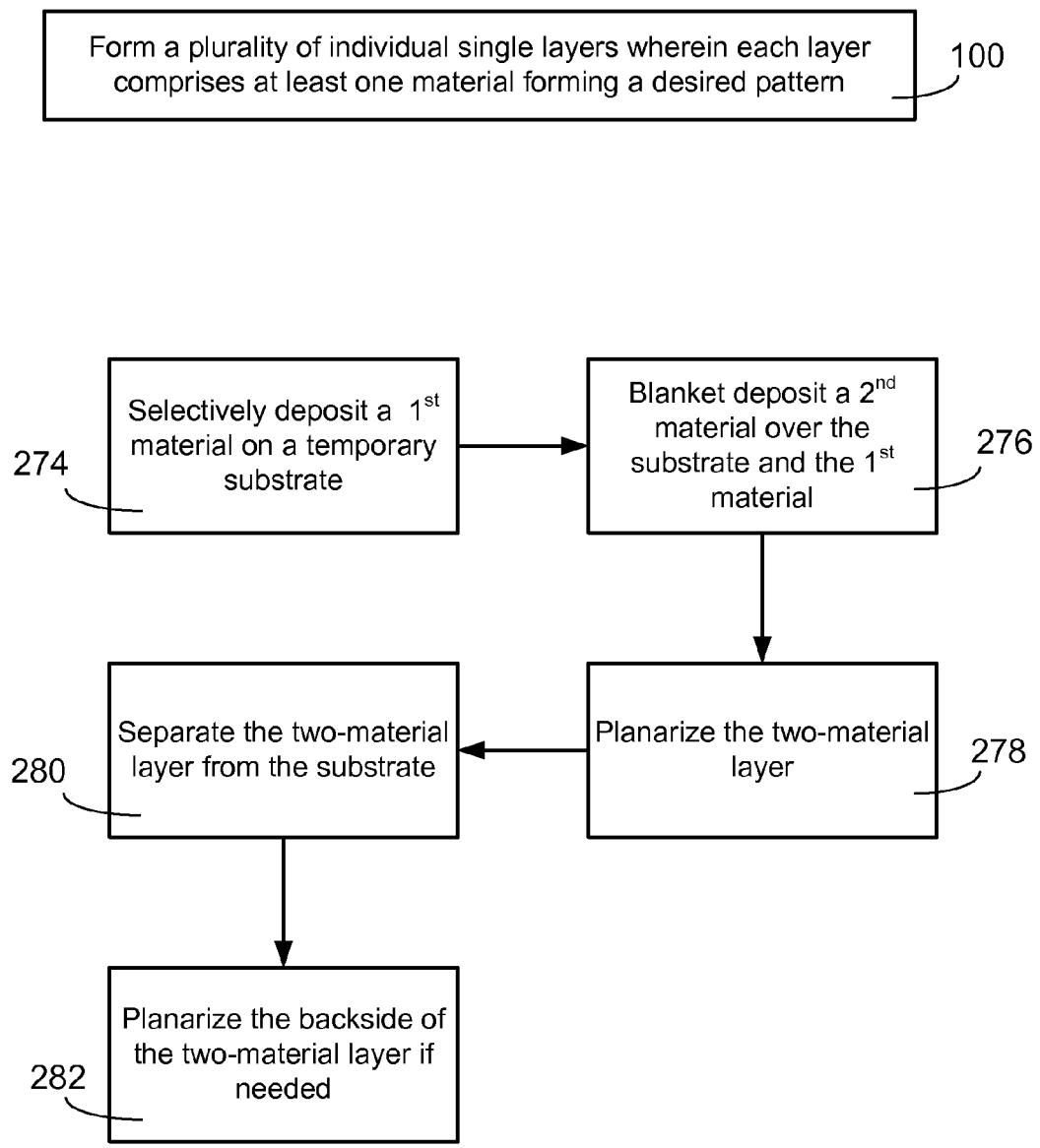
FIG. 23 provides a block diagram indicating a process of a fourth variation of the third embodiment for building individual single layers comprising at least two materials.

FIG. 23 provides a block diagram indicating a process of a forth variation of the third embodiment for building individual single layers comprising at least two materials. The first block 100 sets forth the goal of this process. The primary steps of this process for forming a single layer comprising two materials are shown from block 274 to block 282.

Block 274 sets forth a first step of the process which involves selectively depositing a layer of a first material onto a temporary substrate by various selective deposition methods such as mask- and maskless-based techniques. For example, a layer of a mask material such as a photoresist can be patterned on a substrate. Then electrodeposition can be operated to fill a material into formed openings in the mask layer. A patterned layer of the material is formed after the mask material is removed. Or the instant-mask plating technique (disclosed in U.S. Pat. No. 6,027,630, issued on Feb. 22, 2000 to Adam Cohen) may be used to directly produce a patterned layer of a material on a substrate. The examples of maskless techniques for forming a patterned layer of a material include localized electrodeposition and inkjet-type printing or dispensing.

Block 276 sets forth a second step of the process which involves blanket depositing a second material over the exposed substrate and the first material by using various deposition methods such as, but not limited to, electrochemical deposition such as electroplating or electroless plating, physical deposition such as vacuum deposition (PVD, CVD, sputtering, and the like) and thermal and cold spray. Liquid polymers may be sprayed or spread and then be solidified by use of heat, radiation or the like. Those of skill in the art will understand that there are also other deposition methods suitable for this purpose.

Block 278 sets forth a third step of the process which involves planarizing the two-material layer via diamond lapping, diamond polishing, CMP, milling, grinding, or the like so that the layer reaches a predetermined thickness and the layer surface reaches a predetermined flatness and smoothness.

Block 280 sets forth a fourth step of the process which involves separating the two-material layer from the temporary substrate.

Block 282 sets forth a fifth step of the process which involves planarizing the backside surface of the two-material layer if needed. The backside surface is the surface that was attached on the substrate surface.

It should be understood that the various features and alternatives presented above in association with the processes of FIGS. 20-22, mutatis mutandis, may be applied to form variations to the process of FIG. 23 and vice-a-versa.

Specific examples will be discussed to teach working principles of the third embodiment of the invention for forming single layers comprising at least two materials, but are not intended to limit the scope of the invention to those examples presented. Rather, the scope of the invention is intended to be set by the claims interpreted in view of the specification.

FIGS. 24A-24G provide schematic illustrations of side views at various stages of a first example of the process of FIG. 20 for building a single layer comprising two materials, 316L stainless steel and nickel.

Figure 24A:
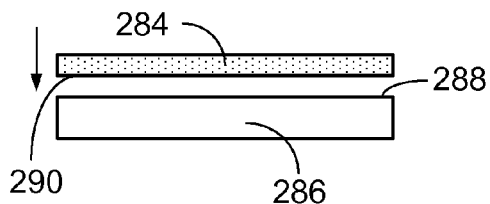
FIGS. 24A-24G provide schematic illustrations of side views at various stages of a first example of the process of FIG. 20 for building a single layer comprising two materials, 316L stainless steel and nickel.

In FIG. 24A, a 316L stainless steel layer 284 with a proper thickness is to be attached to a copper substrate 286. High precision stainless steel foils may be used as they not only have smooth and flat surfaces, but also have uniform thicknesses. Alternatively, the both sides of a stainless layer can be planarized by using diamond lapping and polishing or the like so that the both surfaces become flat and smooth and the layer has a uniform thickness. The copper substrate 286 has two functions. One function is to provide a base on which a two-material layer (stainless steel and nickel) can be built. The other function is to act as a releasing layer. It means that after the two-material layer is fully built on it, the copper substrate 286 will be dissolved so that a free-standing two-material layer can be obtained. Copper top surface 288 to be bonded to the stainless steel layer 284 may be flat and smooth. Either diamond lapping or diamond turning can be employed to machine the copper surface 288 to be flat and smooth. The stainless steel layer 284 may be attached onto the copper substrate 286 via, e.g., diffusion bonding with a proper pressure on the two materials and a proper bonding temperature and time in a vacuum chamber. Diffusion bonding is a known art. Bonding parameters can be found on books, literature or the like. Alternatively the parameters can be obtained by experiments. Right before bonding, two bonding surfaces 288 and 290 may need to be pretreated so that they become clean and active. For example, acetone cleaning followed by acid dipping may be used for this purpose.

Figure 24B:
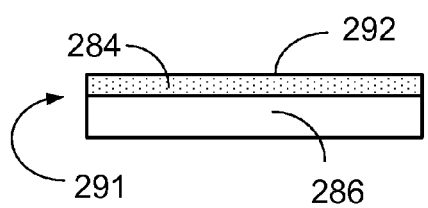

FIG. 24B shows a bonded couple 291 including copper substrate 286 and stainless steel layer 284 after diffusion bonding. The top surface 292 of the stainless steel layer 284 may be planarized via diamond lapping and polishing or the like to achieve a required surface flatness and smoothness, and a desired thickness if needed.

Figure 24C:
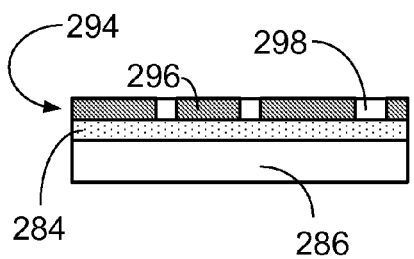

Many techniques may be used to selectively machine or etch the stainless steel layer 284 to form a desired pattern, e.g., electrochemical photo etching, laser machining and the like. In this example, laser micromachining is used to selectively remove at least a portion of the stainless steel layer 284 to form a desired pattern comprising at least one opening. In FIG. 24C, a mask 294 with a desired pattern is placed over the stainless steel layer 284. The mask 294 has light barriers 296 which stop laser light and protect the underneath stainless steel and light apertures 298 through which laser light can etch the underneath stainless steel. An excimer laser may be used to etch the stainless steel layer 284 to form the desired pattern (openings) by exposing the stainless steel layer 284 through the mask 294. It is preferred that the laser machining process can be precisely controlled to just remove all the exposed stainless steel through all the thickness down to the copper top surface, but not damage the copper underneath the removed stainless steel. For example, we can select proper laser machining parameters including laser gas mixtures, laser light intensity, wavelength, pulse duration, pulse energy, pulse frequency, etch rate or etch depth, etc. However, even the copper is partially removed or damaged, it is still fine as we can planarize the backside of the stainless steel layer 284 after it is separated from the copper substrate 286. Note that alignment reference marks (used for aligning individual layers and/or individual groups of layers for forming multi-layer three-dimensional structures) may be included in the desired pattern on the mask 294. Therefore, the alignment reference marks will be formed with the completion of the layer. In terms of fabrication of alignment reference marks, alternatively, we can make them after a multi-material layer has been formed. For example, we may selectively etch a formed single layer by using, e.g., laser machining, to form the alignment marks at desired locations.

Figure 24D:
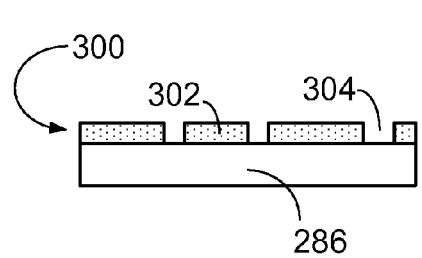

FIG. 24D shows the etching result after the mask 294 has been removed, where the patterned stainless steel 300 has stainless steel features 302 and openings 304.

Figure 24E:
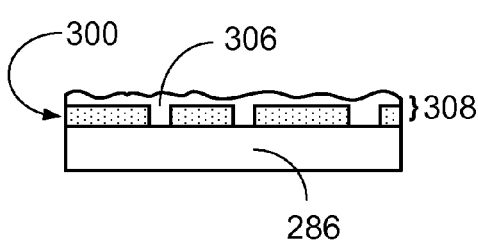

In FIG. 24E, a second material 306, nickel, is blanket deposited over the exposed copper and the stainless steel 300. Nickel deposition can be operated in a nickel plating tank via electrodeposition. A suitable nickel plating bath is a nickel sulfamate plating bath although other nickel plating baths may also be used. The internal stress of the nickel 306 may be controlled to be near zero by adding a suitable stress reducer in the nickel sulfamate bath. Suitable nickel sulfamate plating baths and stress reducers are commercial available. For example, Techni S Nickel Sulfamate bath and JB-100 (stress reducer) can be purchased from Technic, Inc. Before nickel plating, alignment reference marks (openings, not shown) in the stainless steel 300 need to be covered with an insulating material (e.g., AZ4620, a photoresist) to prevent from being filled with nickel. Still before nickel plating, the exposed copper and the stainless steel may be cleaned and activated using such as chemical cleaning or ultrasonic cleaning followed by acid activation or application of a nickel strike. Assure that even the lowest points of the deposited nickel 306 reach a predetermined thickness.

Figure 24F:
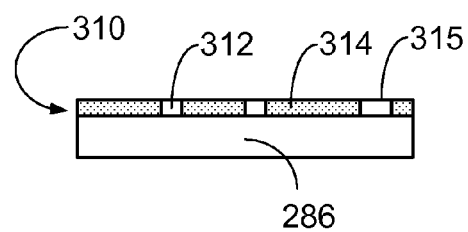

The two-material layer 308 comprising the stainless steel 300 and the nickel 306 shown in FIG. 24E is planarized by using diamond lapping or the like to form a desired two-material layer 310 shown in FIG. 24F. After planarization, both stainless features 314 and the nickel features 312 are exposed and are at the same level. The top surface 315 of the layer 310 reaches predetermined flatness and smoothness. The layer 310 also reaches a predetermined thickness.

To form a layer comprising more than two materials, the above steps (selective machining or etching, blanket deposition and planarization) may be repeated a plurality of times. Note that blanket deposition may be used to deposit different materials. Also note that blanket deposition may be electrodeposition, electroless deposition, physical deposition such as vacuum deposition and spray, and the like.

To form a group of layers, the above steps (attaching, selective machining or etching, blanket deposition and planarization) may be repeated a plurality of times.

Figure 24G:
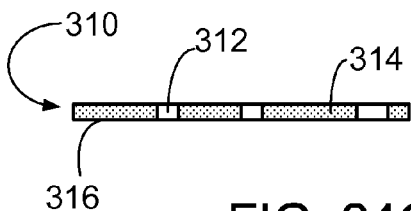

To separate the two-material layer 310 from the copper substrate 286 shown in FIG. 24F, the copper substrate 286 may be dissolved in a copper etchant. For example, Enstrip C-38 (Enthone Inc.) is a very effective copper etchant which is compatible with nickel and stainless steel. FIG. 24G shows a free-standing two-material layer 310.

Additionally, the backside surface 316 of the layer 310 may be planarized to reach predetermined flatness and smoothness if the surface flatness and smoothness do not meet the requirements after the copper is removed.

If the layer 310 curls due to stress effect after separation, a mechanical approach may be used to flatten the layer 310, e.g., using a rolling machine, a pressing machine, and the like.

The above steps for forming a single two-material layer and/or a group of two-material layers may be repeated a plurality of times to form a plurality of individual single layers and/or individual groups of layers which, after being attached together, compose a multi-layer structure. Finally, the nickel is selectively etched away by using a nickel etchant to release a desired multi-layer three-dimensional stainless structure. There are many commercial nickel etchants. For example, we can use Nickel Stripper M-7 (Atotech Inc.) to etch nickel. The etchant is compatible with stainless steel. Alternatively, we can also use a nitric acid solution, by mixing one part (volume) concentrated nitric acid with one part (volume) water together, to dissolve nickel. The nitric acid solution is also compatible with SS 316L.

FIGS. 25A-25K provide schematic illustrations of side views at various stages of a second example of the process of FIG. 20 for building a single layer comprising two materials, silicon and nickel.

Figure 25A:
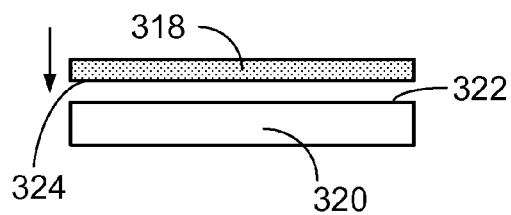
FIGS. 25A-25K provide schematic illustrations of side views at various stages of a second example of the process of FIG. 20 for building a single layer comprising two materials, silicon and nickel.

In FIG. 25A, a double-side polished silicon wafer 318 with a proper thickness is to be attached to a copper substrate 320. Copper surface 322 to be attached to silicon wafer surface 324 needs to be flat and smooth. Either diamond lapping or diamond turning can be employed to machine the copper surface 322 to become flat and smooth. The silicon wafer 318 may be attached onto the copper substrate 320 via, e.g., diffusion bonding with a proper pressure on the two materials and a proper bonding temperature and time in a vacuum chamber. Right before bonding, the two materials may need to be pretreated to make the two bonding surfaces 322 and 324 clean and active. For example, acetone cleaning followed by acid dipping may be used for this purpose.

Figure 25B:
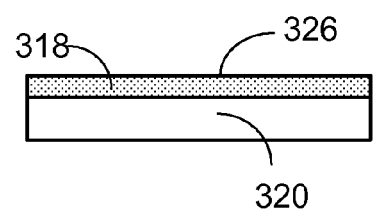

FIG. 25B shows the bonded copper substrate 320 and the silicon wafer 318 after diffusion bonding. Top surface 326 of the silicon wafer 318 may be planarized by diamond lapping and polishing or CMP (Chemical Mechanical Polishing) to achieve a desired thickness and surface flatness and smoothness if the bonding process degrades the silicon surface quality.

Figure 25C:
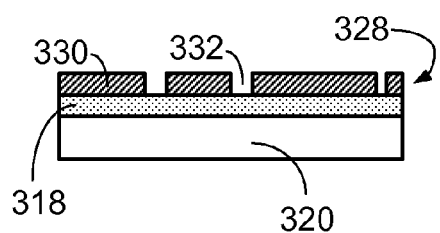

Many methods may be used to selectively machine or etch the silicon wafer 318 to form a desired pattern, e.g., chemical etching, electrochemical etching, DRIE (Deep Reactive Ion Etching), laser micromachining, and the like. In this example, DRIE is used to etch the silicone wafer 318. In FIG. 25C, a photoresist such as AZ4620 is applied and UV-exposed through a photomask (not shown) to form a pattern of photoresist 328 on the silicon wafer 318 via a standard cleanroom photolithography process. The photoresist pattern 328 comprises photoresist features 330 and openings 332 which extends from the top surface of the photoresist 328 through the thickness of the photoresist to the top surface of the silicon wafer 318. Note that alignment reference marks (openings) may be included in the photoresist pattern 328. The purpose of the alignment marks is for aligning individual layers and/or individual groups of layers for final attaching or bonding to form a multi-layer structure.

Figure 25D:
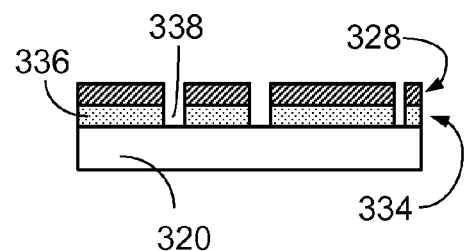

The whole combination of 318, 320 and 328 is placed in a DRIE machine. The silicon which is not covered with the photoresist features 330 is etched away down to the top surface of the copper substrate 320. FIG. 25D shows that a silicon pattern 334 is formed after DRIE, which contains silicon features 336 and through openings 338. A cleaning process such as oxygen plasma or chemical cleaning may be used to remove residues generated during DRIE on the exposed copper area of the copper substrate 320, and on the sidewalls of the openings 338 of the silicon pattern 336.

The photoresist 328 (an insulating material) may be left untouched after DRIE as it can act as a plating mask to prevent from growth of nickel (from blanket deposition that will be described below) to the top silicon surface or prevention from deposition of nickel on the top silicone surface if the silicon is highly conductive. Alternatively, if it is desired, the photoresist 328 may be removed with a photoresist stripper before nickel filling.

Figure 25E:
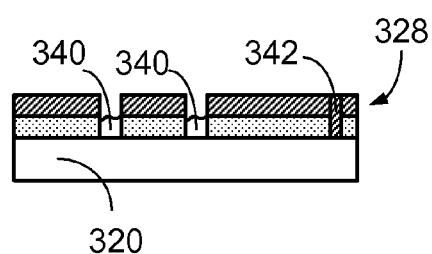

Nickel 340 is filled into the silicon pattern 334 via nickel electroplating shown in FIG. 25E. If through openings are needed on the final layer, prior to nickel plating these openings need to be covered with an insulating material 342 (e.g., AZ4620, a photoresist) shown in FIG. 25E for preventing from being filled with nickel. The operation of nickel plating has been discussed above in the process of FIG. 24. Assure that even the lowest points of the nickel 340 reach a predetermined thickness. After nickel plating, the photoresist 328 is stripped with a photoresist stripper. A nickel-silicon composite layer 346 is formed and shown in FIG. 25F, which comprises a though opening 348.

Figure 25F:
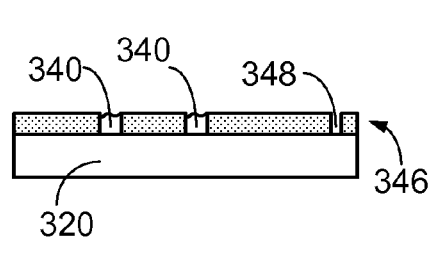
Figure 25G:
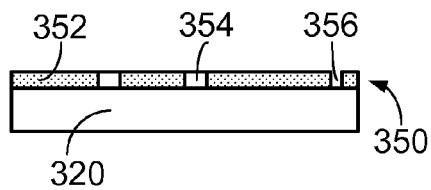

The two-material layer 346 shown in FIG. 25F is planarized (e.g., diamond lapping, CMP and the like) to form a desired two-material layer 350 shown in FIG. 25G. After planarization, both silicon features 352 and nickel features 354 are exposed and at the same level; the top surface of the layer 350 reaches required flatness and smoothness; and the layer 350 also reaches a required thickness.

Figure 25H:
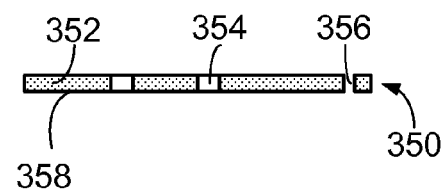

To separate the two-material layer 350 from the copper substrate 320 shown in FIG. 25G, the copper substrate 320 can be dissolved in a copper etchant. For example, Enstrip C-38 (Enthone Inc.) is a very effective copper etchant which is compatible with nickel and silicon. FIG. 25H shows a free-standing layer 350 after the copper 320 has been etched, which has a through opening 356.

Additionally, the backside surface 358 of the layer 350 may be planarized to reach a predetermined flatness and smoothness if the surface flatness and smoothness do not meet the requirements after the copper is removed.

Figure 25I:
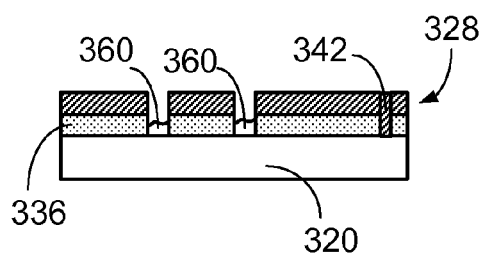
Figure 25J:
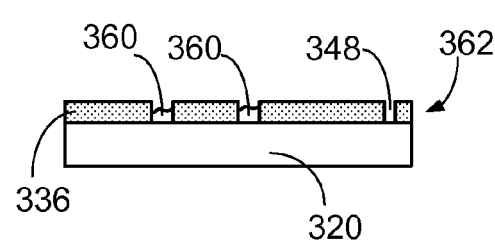
Figure 25K:
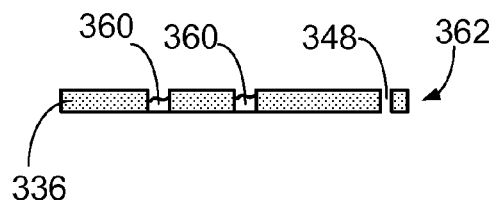

Alternatively, another process scheme shown in FIGS. 25I-25K may be used to avoid the above planarization process step after nickel plating. The function of a sacrificial material is to integrate all structural elements on a layer together as there are isolated structural elements which do not link with other structural elements. The integrity of a layer will be lost without a sacrificial material which acts like an adhesive. Although finally we attach all layers together to form a multi-layer structure, in some cases, we only need to attach the structural elements on the layers together as the sacrificial material will be finally removed completely. Therefore to avoid planarization, we can deposit nickel 360 below the top surface of the silicon wafer 336 shown in FIG. 25I. FIG. 25J shows a desired two-material layer 362 where the photoresist has been stripped. FIG. 25K shows the two-material layer 362 after dissolving the copper substrate 320. As the nickel 360 is below the top surface of the silicon 336, there is no need to planarize the two-material layer as long as the thickness, smoothness and flatness of the layer 362 meet the fabrication requirements.

FIGS. 26A-26F provide schematic illustrations of side views at various stages of an example of the process of FIG. 21 for building a single layer comprising two materials, stainless steel and nickel.

In FIG. 26A, a thick stainless steel layer (e.g., 316L) 364 is provided. The stainless steel layer has a uniform thickness and the both sides of the layer 364 are flat and smooth meeting the layer requirements.

In FIG. 26B, a mask 366 with a desired pattern is placed over the stainless steel layer 364. The mask 366 has light barriers 368 which stop laser light and protect the underneath stainless steel and light apertures 370 through which laser light can etch the underneath stainless steel. An excimer laser may be used to etch the stainless steel layer 364 to form the desired pattern (openings in the layer 364) by exposing the stainless steel layer 364 through the mask 366.

FIG. 26C shows the etching result after the mask 366 has been removed, where the patterned stainless steel layer 372 comprises blind openings 374.

In FIG. 26D, a second material 376, nickel, is blanket deposited over the stainless steel 372 to form a two-material layer 378. Nickel deposition can be operated in a nickel plating tank via electrodeposition. The operation of nickel plating has been discussed above in the process of FIG. 24. Assure that even the lowest points of the nickel 376 reach a predetermined thickness.

Top surface 380 of the two-material layer 378 shown in FIG. 26D is then planarized (e.g., diamond lapping and the like) to form a two-material layer 382 shown in FIG. 26E. After planarization, the stainless steel surface is exposed and has the same level as the surface of nickel features 384; the top surface of the layer 382 reaches a required flatness and smoothness; and the layer 382 also reaches a required thickness.

The bottom surface 386 of the layer 382 in FIG. 26E is then planarized to form a two-material layer 388 shown in FIG. 26F. After planarization, the surface of nickel features 390 is exposed and has the same level as the surface of stainless features 392; the bottom surface of the layer 382 reaches required flatness and smoothness; and the layer 382 also reaches a final thickness.

Alternatively, both the frontside surface and the backside surface may be planarized simultaneously by using a planarization machine which is capable of treating the both sides of a sample at the same time.

FIGS. 27A-27G provide schematic illustrations of side views at various stages of an example of the process of FIG. 22 for building a single layer comprising two materials, gold and nickel.

Figure 27A:
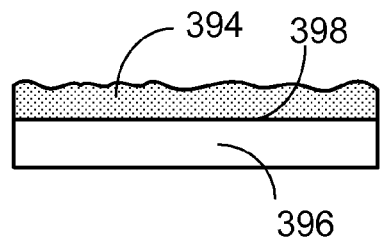
FIGS. 27A-27G provide schematic illustrations of side views at various stages of an example of the process of FIG. 22 for building a single layer comprising two materials, gold and nickel.

In FIG. 27A, Nickel 394 has been blanket electrodeposited on a copper substrate 396. In this example, copper surface 398 was planarized to be flat and smooth prior to nickel plating. The copper surface 398 was also cleaned and activated in an acid solution such as 5% (volume) sulfuric acid solution right before nickel plating. The operation of nickel plating has been discussed above in the process of FIG. 24. Assure that even the lowest points of the nickel 394 reach a predetermined thickness.

Figure 27B:
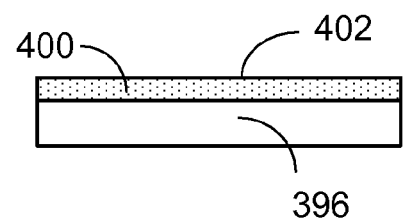

In FIG. 27B, Nickel 394 is planarized to become a desired nickel layer 400 which has a predetermined thickness. In addition, the nickel surface 402 is flat and smooth after planarization to meet the requirements of the following process steps.

The process steps of FIGS. 27C-27G are similar to those of FIGS. 24C-24G.

Figure 27C:
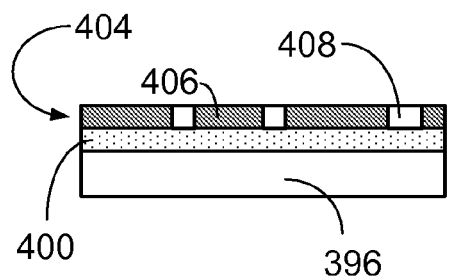

In FIG. 27C, the nickel layer 400 is selectively etched via laser micromachining through a mask 404 which has light barriers 406 which stop laser light and protect the underneath nickel and light apertures 408 through which laser light can etch the underneath nickel.

Figure 27D:
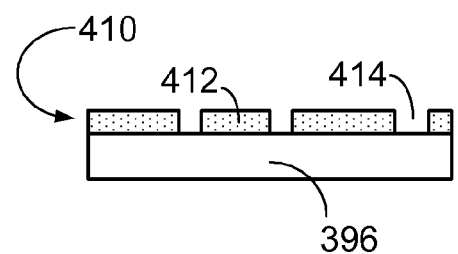

FIG. 27D shows the etching result after the mask 404 has been removed, where a patterned nickel layer 410 has nickel features 412 and through openings 414.

Figure 27E:
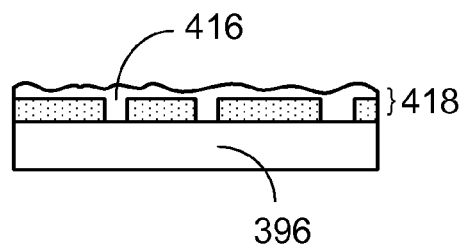

In FIG. 27E, a second material 416, gold, is blanket deposited over the exposed copper and the nickel. Gold deposition can be operated in a gold plating tank via electrodeposition. A suitable gold plating bath may be selected from either gold cyanide baths or non-cyanide baths. For example, a suitable non-cyanide bath is Techni Gold 25 from Technic, Inc. Before gold plating, the exposed copper and the nickel may be cleaned and activated using such as chemical cleaning or ultrasonic cleaning followed by acid activation (e.g., 5% (volume) sulfuric acid solution). Assure that even the lowest points of the gold 416 reach a predetermined thickness for gold deposition.

Figure 27F:
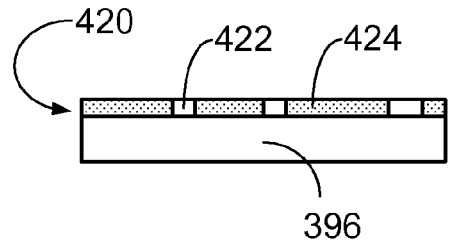

The two-material layer 418 shown in FIG. 27E is planarized with diamond lapping or the like to form a desired two-material layer 420 shown in FIG. 27F. After planarization, both gold features 422 and the nickel features 424 are exposed and at the same level. The top surface of the layer 420 reaches predetermined flatness and smoothness. The layer 420 also reaches a predetermined thickness.

Figure 27G:
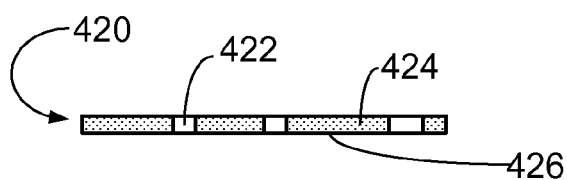

To separate the desired two-material layer 420 from the copper substrate 396 shown in FIG. 27F, the copper substrate 396 may be dissolved in a copper etchant. For example, Enstrip C-38 (Enthone Inc.) is a very effective copper etchant which is compatible with nickel and gold. FIG. 27G shows a free-standing layer 420. If the layer 420 curls due to stress effect after separation, a mechanical approach may be used to flatten the layer 420, e.g., using a rolling machine, a pressing machine, and the like.

Additionally, the backside surface 426 of the layer 420 may be planarized to reach predetermined flatness and smoothness if the surface flatness and smoothness do not meet the requirements after the copper is removed.

FIGS. 28A-28F provide schematic illustrations of side views at various stages of an example of the process of FIG. 23 for building a single layer comprising two materials, gold and nickel.

Figure 28A:
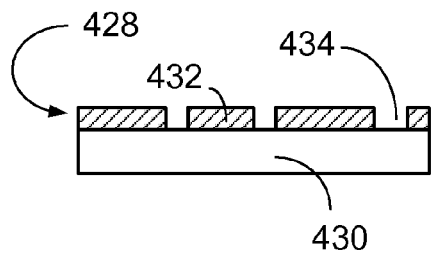
FIGS. 28A-28F provide schematic illustrations of side views at various stages of an example of the process of FIG. 23 for building a single layer comprising two materials, gold and nickel.

In FIG. 28A, a photoresist such as AZ4620 is applied on a copper substrate 430 and UV-exposed through a photomask (not shown) to form a patterned layer of photoresist 428 which comprises photoresist features 432 and through openings 434. This can be done with a standard cleanroom photolithography process. The copper substrate 430 has a flat, smooth and clean surface suitable for the application of the photoresist on it.

Figure 28B:
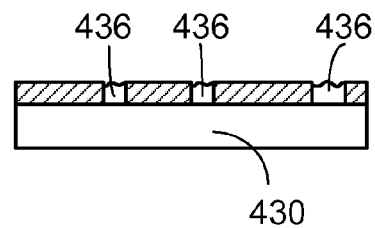

In FIG. 28B, a first material 436, nickel, has been deposited into the openings 434. The operation of nickel plating has been discussed above in the process of FIG. 24. Assure that even the lowest points of the nickel 436 reach a predetermined thickness.

Figure 28C:
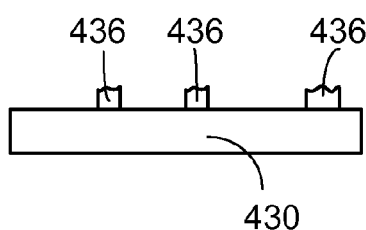

After nickel plating, the photoresist layer 428 is stripped with a photoresist stripper. A nickel pattern consisting of the nickel features 436 is shown in FIG. 28C.

Figure 28D:
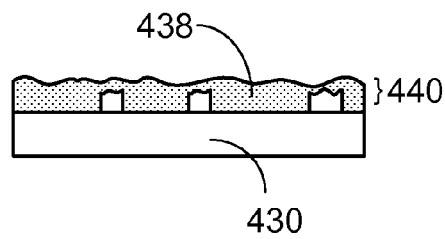

In FIG. 28D, a second material 438, gold, is blanket deposited over the exposed copper and the nickel. The operation of gold plating has been discussed above in the process of FIG. 27. Assure that even the lowest points of the gold 438 reach a predetermined thickness for gold deposition.

Figure 28E:
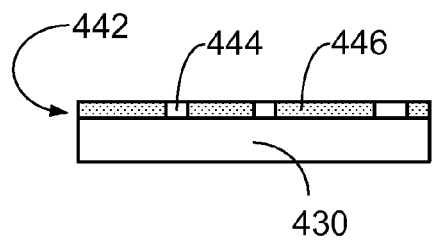
Figure 28F:
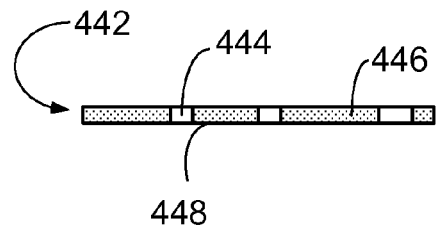

The two-material layer 440 shown in FIG. 28D is then planarized with diamond lapping or the like to form a desired two-material layer 442 shown in FIG. 28E. After planarization, both gold features 446 and the nickel features 444 are exposed and at the same level. The top surface of the layer 442 reaches predetermined flatness and smoothness. The layer 442 also reaches a predetermined thickness.

To separate the desired two-material layer 442 from the copper substrate 430 shown in FIG. 28E, the copper substrate 430 may be dissolved in a copper etchant as discussed above. If the layer 442 curls due to stress effect after separation, a mechanical approach may be used to flatten the layer 364, e.g., using a rolling machine, a pressing machine, and the like.

Additionally, the backside surface 448 of the layer 442 may be planarized to reach predetermined flatness and smoothness if the surface flatness and smoothness do not meet the requirements after the copper is removed.

Although any one of the above four processes alone can be used to build groups of layers, each layer comprising at least one material, those skill in the art will understand that a group of layers may be fabricated by using only one of the processes, or by combinations of the processes. The four processes may also be used together via various combinations to produce groups of multi-material layers.

Figure 29:
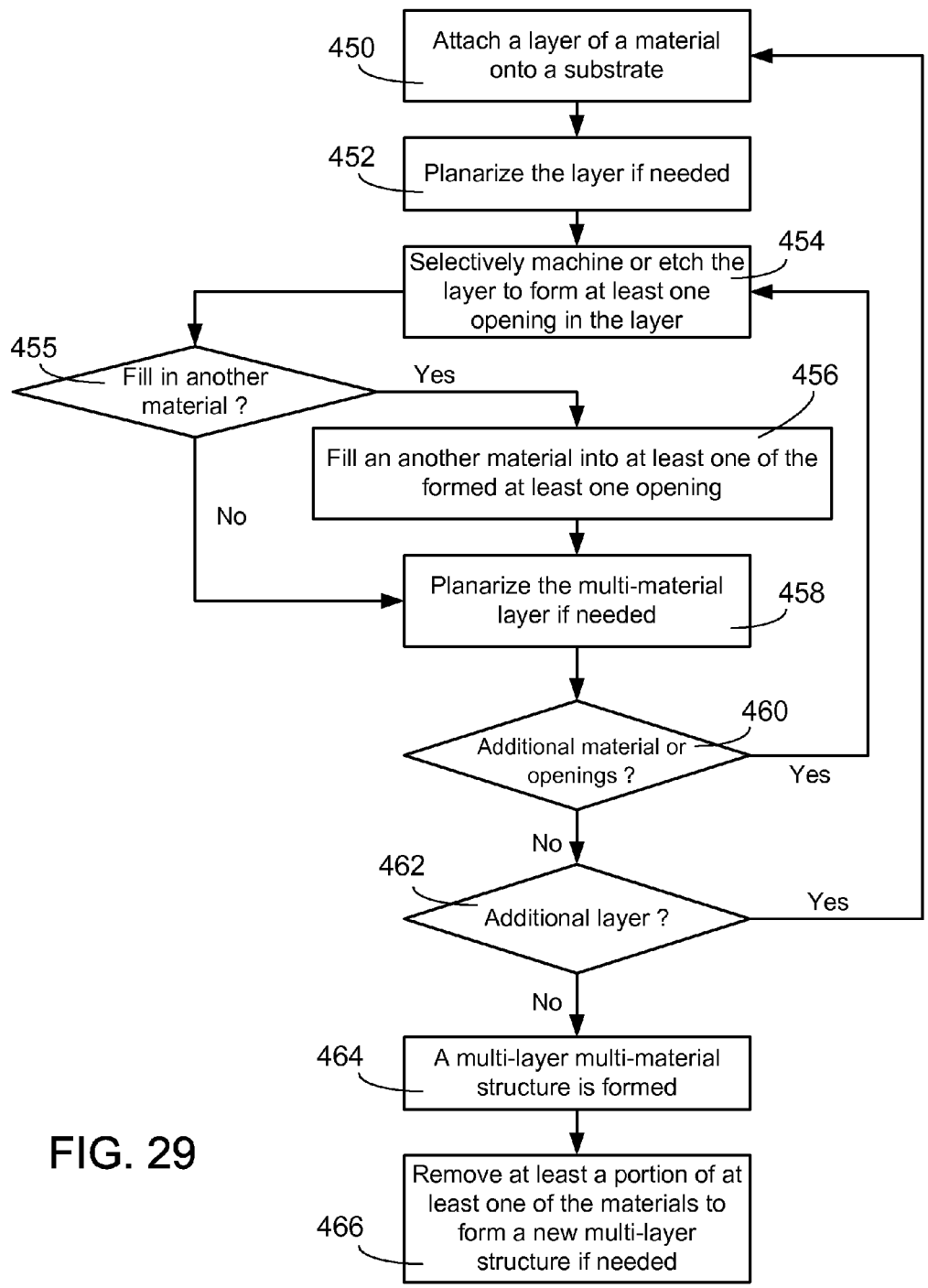
FIG. 29 provides a block diagram indicating the primary steps of a process for forming a multi-layer three-dimensional structure according to a fourth embodiment of the present invention where the structure is formed via successively attaching and fabricating individual single layers.

FIG. 29 provides a block diagram indicating the primary steps of a process for forming a multi-layer three-dimensional structure according to a fourth embodiment of the present invention where the structure is formed via successively attaching and fabricating individual single layers.

Blocks 450-454 and 456-458 are similar to blocks 236-244 in FIG. 20.

Block 450 sets forth a first step of the process of the fourth embodiment of the present invention, which involves attaching a layer of a material onto a substrate by using methods such as diffusion bonding and the like.

Block 452 sets forth a second step of the process which involves planarizing the attached layer. This step is optional. This step needs to be applied if (1) the layer needs to be machined down to a predetermined thickness, (2) the layer needs to have a uniform thickness, and/or (3) the layer top surface needs to achieve flatness and smoothness for the following processing steps.

Block 454 sets forth a third step of the process which involves selectively machining or etching the attached layer to form at least one opening in the layer.

Block 455 is a decision point where the next process direction will be determined by answering the question in the block. If an another material is needed to be filled into at least one formed opening, the process moves forward to block 456. Otherwise, the process moves forward to block 458.

Block 456 sets forth a fourth step of the process which involves filling an another material into at least one opening formed in the layer.

Block 458 sets forth a fifth step of the process which involves planarizing the two-material layer. This step needs to be operated if the following one or more requirements should be met.

(1) The two-material layer needs to be machined to a predetermined thickness;

(2) Both materials need to be exposed and both material surfaces need to be flush; and/or (3) The two-material layer surface needs to achieve predetermined flatness and smoothness.

Block 460 is a decision point where the next process direction will be determined by answering the question in the block. If an additional material and/or at least an additional opening are needed, then the blocks 454-458 will be repeated. If no additional materials and/or additional openings are needed, the process moves forward to block 462.

Block 462 is another decision point where the next process direction will be determined by answering the question in the block. If an additional layer is needed, then the blocks 450-460 will be repeated. If no additional layer is needed, a multi-layer multi-material structure is formed as shown in block 464 where at least one layer of the formed multi-layer structure comprises at least one sacrificial material that is used as a mechanical support at least for structural material features.

Block 466 sets forth an additional step of the process if needed, which involves removing at least a portion of at least one of the materials (e.g., sacrificial material) of the multi-layer multi-material structure to form a new multi-layer structure via chemical etching, electrochemical etching, or the like.

It should be understood that the various features and alternatives presented above in association with the processes of FIGS. 1-28, mutatis mutandis, may be applied to form variations to the process of FIG. 29 and vice-a-versa. For example, after an individual multi-material layer is formed, it may be etched to remove at least a portion of at least one of the materials before a next layer is attached onto it. A layer may need to be aligned to alignment reference marks or features on a previous layer or substrate onto which the layer will be attached.

A specific example will be discussed to teach working principles of the fourth embodiment of the invention for forming a multi-layer three-dimensional structure, but are not intended to limit the scope of the invention to the implementation presented. Rather, the scope of the invention is intended to be set by the claims interpreted in view of the specification.

FIGS. 30A-30H provide schematic illustrations of side views at various stages of an example of the process of FIG. 29 for building a multi-layer three-dimensional stainless steel structure.

Figure 30A:
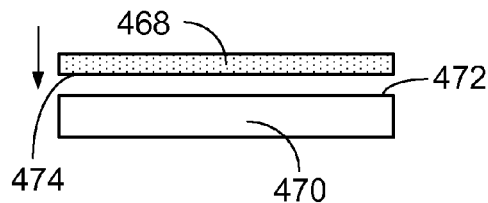
FIGS. 30A-30H provide schematic illustrations of side views at various stages of an example of the process of FIG. 29 for building a multi-layer three-dimensional stainless steel structure.

In FIG. 30A, a first 316L stainless steel layer 468 with proper thickness, flatness and smoothness is to be attached to a ceramic substrate 470 such as alumina. The substrate 470 has suitable surface flatness and smoothness for the attaching process. Either diamond lapping or the like can be employed to machine the substrate surface 472 to be flat and smooth. High precision stainless steel layers may be used as they not only have smooth and flat surfaces, but also have uniform thicknesses. Alternatively, the both sides of a stainless layer can be planarized by using diamond lapping and polishing or the like so that the both surfaces become flat and smooth and the layer has a uniform thickness. The stainless steel 468 can be attached onto the substrate 470 via, e.g., diffusion bonding with a proper pressure on the two materials and a proper bonding temperature and time in a vacuum chamber. Right before diffusion bonding, the two materials may need to be pretreated to make two bonding surfaces 472 and 474 clean and active. For example, acetone cleaning followed by acid dipping may be used for this purpose.

Figure 30B:
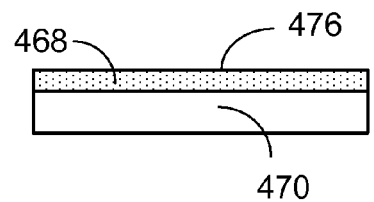

FIG. 30B shows the bonded ceramic substrate 470 and stainless steel layer 468 after diffusion bonding. The top surface 476 of the stainless steel layer 468 may be planarized via diamond lapping and polishing to achieve required surface flatness and smoothness, and a desired thickness if needed.

Figure 30C:
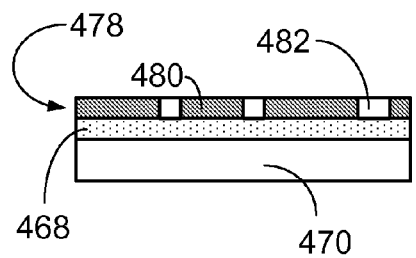

Many methods may be used to selectively machine or etch stainless steel layers to form a desired pattern, e.g., electrochemical photo etching, laser machining or the like. In this example, laser micromachining is used to selectively remove a portion of the stainless steel layer 468 to form a desired pattern comprising at least one opening. In FIG. 30C, a mask 478 with a desired pattern is placed over the stainless steel layer 468. The mask 478 has light barriers 480 which stop laser light and protect the underneath stainless steel and light apertures 482 through which laser light can etch the underneath stainless steel. An excimer laser may be used to etch the stainless steel layer 468 to form the desired pattern (openings) by exposing the stainless steel layer 468 through the mask 478. The laser machining process needs to be precisely control to just remove all the exposed stainless steel through all the thickness down to the ceramic substrate top surface, but not damage or little damage the substrate underneath the removed stainless steel.

Figure 30D:
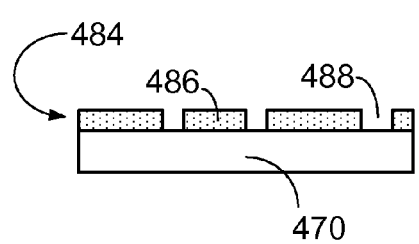

FIG. 30D shows the etching result after the mask 478 has been removed, where a stainless steel pattern 484 comprises stainless steel features 486 and openings 488.

Figure 30E:
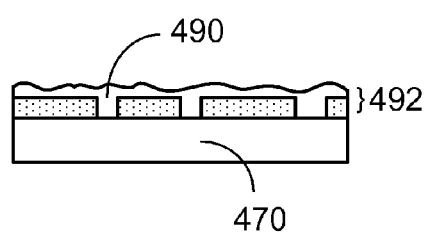

In FIG. 30E, an another material 490, copper, is blanket electrodeposited over the exposed substrate and the stainless steel. Copper deposition can be operated in a copper plating tank via electrodeposition. A suitable copper plating bath may be selected from acid copper baths, pyrophosphate copper baths, cyanide copper baths or other types of baths. For example, Techni FB acid copper bath (Technic, Inc.) may be used. Before copper plating, the exposed ceramic surface may need to be metalized so that copper can be deposited on the ceramic surface. This can be done by, e.g., sputtering a thin layer of copper or electroless depositing a thin copper layer on the ceramic surface. Still before copper plating, the metal surfaces may be cleaned and activated using such as chemical cleaning or ultrasonic cleaning followed by acid activation. Assure that even the lowest points of the copper 490 reach a predetermined thickness for copper deposition.

Figure 30F:
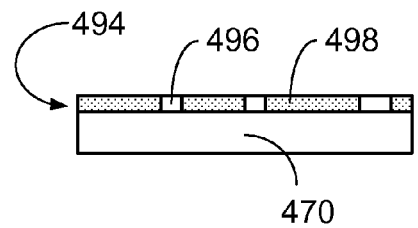

The two-material layer 492 shown in FIG. 30E is planarized (e.g., diamond lapping or the like) to form a desired two-material layer 494 shown in FIG. 30F. After planarization, both stainless features 498 and the copper features 496 are exposed and at the same level. The top surface of the layer 494 reaches predetermined flatness and smoothness. The layer 494 also reaches a predetermined thickness.

Figure 30G:
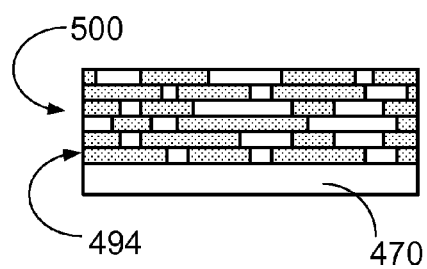

The process steps shown in FIGS. 30A-30F are repeated a plurality of times to form a multi-layer (6-layer in this example) structure 500 shown in FIG. 30G where each layer comprising two materials, copper and stainless steel. Note that for bonding the second, third, fourth, fifth and sixth stainless steel layers, each layer is first bonded to a previously formed layer and then machined to form a two-material layer that again becomes a new base for accepting a next layer. For example, the second stainless steel layer is bonded to the formed two-material layer 494. Again, the laser machining process needs to be precisely control to just remove all the exposed stainless steel through all the thickness down to the top surface of a previous layer, but not damage or little damage the material or materials (i.e., stainless steel, copper, or both) underneath the removed stainless steel. For example, we can select proper laser machining parameters including laser gas mixtures, laser light intensity, wavelength, pulse duration, pulse energy, pulse frequency, etch rate or etch depth, etc.

Figure 30H:
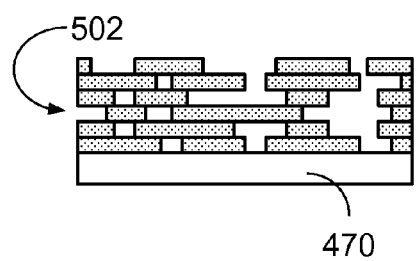

In FIG. 30H, the copper is etched to form a final multi-layer three-dimensional stainless steel structure 502 on the ceramic substrate 470. For example, Enstrip C-38 (Enthone Inc.) is a very effective copper etchant which is compatible with ceramic and stainless steel.

Although the fourth embodiment of the present invention is a successive process, meaning that the building sequence is a layer-by-layer style, it solves several major drawbacks of the multi-layer electrochemical fabrication techniques as follows.

In contrast with the multi-layer electrochemical fabrication methods, the fourth embodiment of the present invention can use bulk materials as structural materials. Although a small portion of materials can be electrochemical deposited practically and cost-effectively, in some cases, it may prefer to use bulk materials as their material properties are better than the ones of their corresponding materials made with electrochemical deposition. With using bulk materials, lots of new material structures can be made. We now can build three-dimensional structures of stainless steel, titanium and its alloys, silicon, silicon carbide and even non-metal materials, which are impossible to be made by using the known three-dimensional microfabrication techniques. In addition, with using bulk materials, layer thickness will not be an issue as commercial bulk materials with various thicknesses can be selected to meet different thickness requirements for the fabrication of three-dimensional structures. Alternatively, we can also machine bulk materials to obtain required thicknesses.

In contrast with the electrochemical multi-layer fabrication methods, the fourth embodiment of the present invention can build layers, each of which can comprise multi-materials.

Still in contrast with the electrochemical multi-layer fabrication methods, the fourth embodiment of the present invention uses an attaching process to attach a layer of a bulk material either on a previous built layer or on a substrate. Unlike the electrochemical multi-layer methods which require a continuous surface without openings of a previous layer for building a next layer on it, the fourth embodiment of the present invention can build a next layer on a previous layer with either a continuous surface without openings or a discontinuous surface comprising openings. Thus, the fourth embodiment of the present invention can make complex three-dimensional microstructures, for example, comprising sealed cavities.

It should note that all the features disclosed as well as combinations of the features disclosed are the object of this invention. While the present invention has been described with reference to particular embodiments and examples thereof, it will be understood that many further embodiments, alternatives, modifications and implementations will be apparent by those skilled in the art without actually departing from the spirit and scope of the invention as defined in the above description. As such, it is not intended that the invention be limited to the particular illustrative embodiments and examples described above but instead that it be solely limited by the claims presented hereafter.

What is claimed is:

1. A method for forming a multi-layer three-dimensional structure, comprising:
 (a) forming a material layer on a temporary substrate wherein the material layer comprises at least one material wherein the at least one material comprises at least one structural material forming a pattern comprising at least one structural feature;
(b) removing the temporary substrate to free the material layer;
(c) repeating the steps of (a) and (b) one or more times to form a plurality of material layers wherein at least one of the plurality of material layers comprises a plurality of discrete structural features wherein the plurality of discrete features are held together with at least one sacrificial material; and
(d) attaching at least the plurality of material layers together in a predetermined arrangement.

2. The method of claim 1, further comprising:
removing at least a portion of the at least one sacrificial material after the attaching step (d).

3. The method of claim 1 wherein the formation of the material layer on the temporary substrate in the forming step (a), the material layer comprising at least two materials, comprises:
(i) attaching or depositing a layer of a first material onto the temporary substrate;
(ii) forming at least one opening in the layer of the first material to form a pattern; and
(iii) filling at least a second material into at least one of the at least one opening to form the material layer.

4. The method of claim 3,
wherein, in the forming step (ii), the at least one opening comprises at least one through opening wherein the at least one through opening results in the formation of a plurality of discrete features in the layer of the first material wherein the plurality of discrete features are supported by the temporary substrate; and
wherein, in the filling step (iii), the at least one of the at least one opening comprises the at least one through opening.

5. The method of claim 3, further comprising:
(a) planarizing the layer of the first material after the attaching or depositing step (i) and before the forming step (ii); and/or
(b) planarizing the formed material layer after the filling step (iii).

6. The method of claim 1 wherein the formation of the material layer on the temporary substrate in the forming step (a), the material layer comprising at least two materials, comprises:
(i) forming at least a first material over at least one selected region of the temporary substrate to form a pattern;
(ii) forming at least a second material over at least a portion of the at least first material and at least one selected exposed region of the temporary substrate to form a multi-material structure; and
(iii) planarizing the multi-material structure to at least reach a predetermined thickness such that at least a portion of the at least first material covered by the at least second material is exposed, thereby forming the material layer.

7. The method of claim 1, further comprising:
planarizing the material layer after the removing step (b) and before the attaching step (d).

8. The method of claim 7 wherein the planarizing step comprises using lapping and/or polishing.

9. The method of claim 1 wherein the attaching step (d) comprises using diffusion bonding.

10. The method of claim 1 wherein at least two of the plurality of material layers comprise a structural material of silicon and wherein, in the attaching step (d), the attaching of the at least two material layers comprises using silicon direct bonding.

11. The method of claim 1 wherein at least one of the plurality of material layers comprises a plurality of sub-layers.

12. A method for forming a multi-layer three-dimensional structure, comprising:
(a) providing a substrate;
(b) providing a layer of a material;
(c) attaching the layer of the material onto the substrate or onto a previously formed layer;
(d) processing the layer of the material to form a new layer comprising at least one material forming a pattern,
wherein one of the at least one material is the material of the layer of the material,
wherein the at least one material comprises at least one structural material, and
wherein the processing operation comprises at least forming at least one opening in the layer of the material; and
(e) repeating the steps from (b) to (d) one or more times to form the multi-layer three-dimensional structure, wherein at least one layer of the multi-layer three-dimensional structure comprises at least one sacrificial material.

13. The method of claim 12, further comprises:
removing at least a portion of the at least one sacrificial material after the repeating step (e).

14. The method of claim 12 wherein the processing step (d), for the formation of the new layer comprising at least two materials, comprises:
(i) forming at least one opening in the layer of the material to form a pattern; and
(ii) filling at least an another material into at least one of the at least one opening.

15. A method for forming a multi-layer three-dimensional structure, comprising:
(a) forming a plurality of separate layers,
wherein at least two of the plurality of separate layers are not attached together directly or indirectly,
wherein each of the plurality of separate layers comprises at least a structural material forming a pattern comprising at least one structural feature, and
wherein at least one of the plurality of separate layers comprises a plurality of discrete structural features wherein the plurality of discrete structural features are held together with at least one sacrificial material;
(b) attaching at least the plurality of separate layers together in a predetermined arrangement;
(c) removing at least a portion of the at least one sacrificial material, thereby forming the multi-layer three-dimensional structure; and
(d) surface-treating the multi-layer three-dimensional structure by removing a portion of a surface of the multi-layer three-dimensional structure and/or by forming at least one layer over at least a portion of a surface of the multi-layer three-dimensional structure.

16. The method of claim 15 wherein the multi-layer three-dimensional structure comprises a structural material of nickel-titanium (NiTi) alloy and wherein the surface-treating step (d) comprises:
selectively removing nickel from at least a portion of a surface of the NiTi alloy with chemical etching or electrochemical etching to reduce the amount of nickel on the at least a portion of the surface of the NiTi alloy.

17. The method of claim 15 wherein the formation of at least one of the layers in the forming step (a), each of the at least one layer comprising at least two materials, comprises:
   (i) providing a layer of a first material;
   (ii) forming at least one opening in the layer of the first material to form a pattern;
   (iii) filling at least a second material into at least one of the at least one opening to form a multi-material layer; and
   (iv) planarizing the multi-material layer.

18. A method for forming a multi-layer three-dimensional structure, comprising:
   (a) forming a plurality of individual layers,
      wherein each of the plurality of individual layers comprises at least a silicon structural material forming a pattern comprising at least one silicon feature, and
      wherein at least one of the plurality of individual layers comprises a plurality of discrete silicon features wherein the plurality of discrete silicon features are held together with at least one sacrificial material;
   (b) attaching at least the plurality of individual layers together in a predetermined arrangement with silicon direct bonding at a first bonding temperature to reach a first bonding strength such that the first bonding temperature prevents bonding failure caused by thermal stress due to the mismatch in coefficient of thermal expansion between the silicon material and the at least one sacrificial material, and the first bonding strength prevents delamination of the bonded at least the plurality of individual layers throughout the below removing step (c);
   (c) removing the at least one sacrificial material from the bonded at least the plurality of individual layers; and
   (d) annealing the bonded at least the plurality of individual layers at a second bonding temperature to reach a second bonding strength wherein the second bonding temperature is greater than the first bonding temperature and wherein the second bonding strength is greater than the first bonding strength, thereby forming the multi-layer three-dimensional structure.

19. The method of claim 16 wherein the silicon direct bonding comprises plasma activation silicon bonding.

20. The method of claim 18 wherein the formation of at least one of the layers in the forming step (a), each of the at least one layer comprising at least two materials, comprises:
   (i) providing a layer of silicon;
   (ii) forming at least one opening in the layer of silicon to form a pattern;
   (iii) filling at least a material into at least one of the at least one opening to form a multi-material layer; and
   (iv) planarizing the multi-material layer.

21. The method of claim 20 wherein the forming step (ii) comprises using deep reactive ion etching (DRIE).

22. A method for forming a multi-layer three-dimensional structure, comprising:
   (a) providing a layer of a sacrificial material;
   (b) forming at least one opening in the layer of the sacrificial material to form a pattern;
   (c) filling at least one structural material into at least one of the at least one opening to form a multi-material layer, wherein the at least one structural material forms a structural pattern comprising at least one structural feature wherein the at least one structural feature is a portion of the multi-layer three-dimensional structure;
   (d) repeating the steps of (a), (b), and (c) one or more times to form a plurality of multi-material layers, wherein at least one of the plurality of multi-material layers comprises a plurality of discrete structural features wherein the plurality of discrete structural features are held together with the sacrificial material; and
   (e) attaching at least the plurality of multi-material layers together in a predetermined arrangement.

23. The method of claim 14, further comprises:
removing at least a portion of the sacrificial material after the attaching step (e).

24. A method for forming a multi-layer three-dimensional structure, comprising:
   (a) forming a plurality of separate layers, wherein at least two of the plurality of separate layers are not attached together directly or indirectly,
      wherein each of the plurality of separate layers comprises at least a structural material forming a pattern comprising at least one structural feature, and
      wherein at least one of the plurality of separate layers comprises a plurality of discrete structural features wherein the plurality of discrete structural features are held together with at least one sacrificial material;
   (b) attaching at least the plurality of separate layers together in a predetermined arrangement, wherein all structural features of the plurality of separate layers form one or more structural components wherein the one or more structural components form the multi-layer three-dimensional structure; and
   (c) removing at least a portion of the at least one sacrificial material from the attached at least the plurality of separate layers to release the multi-layer three-dimensional structure, wherein all of the one or more structural components of the multi-layer three-dimensional structure are immovable.

25. The method of claim 24 wherein the formation of at least one of the layers in the forming step (a), each of the at least one layer comprising at least two materials, comprises:
   (i) providing a layer of a first material;
   (ii) forming at least one opening in the layer of the first material to form a pattern;
   (iii) filling at least a second material into at least one of the at least one opening to form a multi-material layer; and
   (iv) planarizing the multi-material layer.

26. A method for forming a multi-layer three-dimensional structure, comprising:
   (a) forming a plurality of separate layers, wherein each of the layers comprises at least a structural material forming a pattern comprising at least one structural feature, wherein at least one of the layers comprises a plurality of discrete structural features wherein the discrete structural features are held together with at least one sacrificial material, and wherein the formation of at least one of the layers comprises:
      (i) providing a layer of a first material comprising a top surface and a bottom surface opposite to the top surface;
      (ii) forming at least one blind opening from the top surface;
      (iii) filling at least a second material into at least one of the at least one blind opening; and
      (iv) planarizing at least the bottom surface at least to form a new bottom surface wherein at least the second material in at least one filled blind opening is exposed in the new bottom surface; and
   (b) attaching at least the layers together in a predetermined arrangement.

27. The method of claim 26, further comprises:
removing at least a portion of the sacrificial material after the attaching step (b).

28. The method of claim 26 wherein, in the forming step (a), the formed at least one layer comprising at least the first material and the second material is the at least one layer comprising the discrete structural features that are held together with the at least one sacrificial material.

29. The method of claim 26 wherein, in the attaching step (b), at least two of the at least the layers are directly attached together without an intermediate layer therebetween.

* * * * *